United States Patent
Ko et al.

(10) Patent No.: US 9,508,902 B2
(45) Date of Patent: Nov. 29, 2016

(54) OPTOELECTRONIC SEMICONDUCTOR DEVICE

(75) Inventors: Tsun-Kai Ko, Hsinchu (TW); Schang-Jing Hon, Hsinchu (TW); Chien-Kai Chung, Hsinchu (TW); Hui-Chun Yeh, Hsinchu (TW); An-Ju Lin, Hsinchu (TW); Chien-Fu Shen, Hsinchu (TW); Chen Ou, Hsinchu (TW)

(73) Assignee: EPISTAR CORPORATION, Hsinchu (TW)

(*) Notice: Subject to any disclaimer, the term of this patent is extended or adjusted under 35 U.S.C. 154(b) by 567 days.

(21) Appl. No.: 12/562,917

(22) Filed: Sep. 18, 2009

(65) Prior Publication Data

US 2010/0052000 A1    Mar. 4, 2010

Related U.S. Application Data

(63) Continuation-in-part of application No. 12/073,284, filed on Mar. 4, 2008, which is a continuation-in-part
(Continued)

(30) Foreign Application Priority Data

Sep. 18, 2008 (TW) ............................... 97135935 A
Sep. 18, 2008 (TW) ............................... 97135936 A
Jun. 3, 2009 (TW) ............................... 98118503 A

(51) Int. Cl.
*H01L 33/38* (2010.01)
*H01L 33/14* (2010.01)
(Continued)

(52) U.S. Cl.
CPC ............. *H01L 33/382* (2013.01); *H01L 33/14* (2013.01); *H01L 33/22* (2013.01); *H01L 33/42* (2013.01); *H01L 33/44* (2013.01); *H01L 2924/0002* (2013.01)

(58) Field of Classification Search
CPC ..... H01L 33/14; H01L 33/22; H01L 33/382; H01L 33/42; H01L 33/44; H01L 2924/0002; H01L 2924/00
USPC .......................................................... 257/13
See application file for complete search history.

(56) References Cited

U.S. PATENT DOCUMENTS 5,869,849 A * 2/1999 Jou et al. .................... 257/96
6,420,732 B1   7/2002 Kung et al.
(Continued)

FOREIGN PATENT DOCUMENTS

CN          1433578 A     7/2003
CN          1226791 C    11/2005
(Continued)

OTHER PUBLICATIONS

C.H. Kuo, et al."Nitride-based near-ultraviolet LEDs with an ITO transparent contact", Materials Science and Engineering, pp. 69-72.
(Continued)

*Primary Examiner* — A. Sefer
*Assistant Examiner* — Benjamin Tzu-Hung Liu
(74) *Attorney, Agent, or Firm* — Muncy, Geissler, Olds & Lowe, P.C.

(57) ABSTRACT

An optoelectronic semiconductor device in accordance with an embodiment of present invention includes a conversion unit having a first side; an electrical connector; a contact layer having an outer perimeter; and at least three successive discontinuous-regions formed along the outer perimeter and having at least one different factor; wherein the electrical connector, the contact layer, and the discontinuous-regions are formed on the first side of the conversion unit.

23 Claims, 18 Drawing Sheets

Related U.S. Application Data of application No. 11/160,354, filed on Jun. 21, 2005, now Pat. No. 7,385,226, which is a continuation-in-part of application No. 10/906,458, filed on Feb. 21, 2005, now Pat. No. 7,355,210, application No. 12/562,917, which is a continuation-in-part of application No. 12/292,593, filed on Nov. 21, 2008.

(51) Int. Cl.
  *H01L 33/22* (2010.01)
  *H01L 33/42* (2010.01)
  *H01L 33/44* (2010.01)

(56) References Cited

U.S. PATENT DOCUMENTS

| | | | |
|---|---|---|---|
| 6,809,340 B2* | 10/2004 | Kato et al. | 257/79 |
| 6,885,036 B2* | 4/2005 | Tarsa et al. | 257/99 |
| 7,183,586 B2* | 2/2007 | Ichihara et al. | 257/98 |
| 7,385,226 B2 | 6/2008 | Ou et al. | |
| 2007/0257269 A1* | 11/2007 | Cho et al. | 257/95 |
| 2008/0241526 A1 | 10/2008 | Ou et al. | |
| 2009/0159909 A1 | 6/2009 | Lee et al. | |

FOREIGN PATENT DOCUMENTS

| | | |
|---|---|---|
| CN | 1758453 A | 4/2006 |
| CN | 1758453 A | 4/2006 |
| CN | 101490604 | 7/2009 |
| CN | 101685842 A | 3/2010 |
| TW | I237903 | 8/2005 |
| TW | 096111705 | 10/2008 |

OTHER PUBLICATIONS

X Guo, et al., "Current crowding and optical saturation effects in GaInN/GaN light-emitting diodes grown on insulating substrates", Applied Physics Letters, vol. 78, No. 21, May 21, 2001, pp. 3337-3339.

* cited by examiner

OPTOELECTRONIC SEMICONDUCTOR DEVICE

REFERENCE TO RELATED APPLICATION

This application is a continuation-in-part of application Ser. No. 12/073,284, filed Mar. 4, 2008, which is a continuation-in-part of application Ser. No. 11/160,354, now U.S. Pat. No. 7,385,266, filed Jun. 21, 2005, which is a continuation-in-part of application Ser. No. 10/906,458, now U.S. Pat. No. 7,355,210, filed Feb. 21, 2005, and claims the right of priorities based on Taiwan applications Ser. No. 097135935, filed Sep. 18, 2008; Ser. No. 097135936, filed Sep. 18, 2008; and Ser. No. 098118503, filed Jun. 4, 2009, the content of which are hereby incorporated by reference. This application is also a continuation-in-part of application Ser. No. 12/292,593 filed on Nov. 21, 2008.

TECHNICAL FIELD

The application relates to an optoelectronic semiconductor device, and more particularly to an optoelectronic semiconductor device with a contact layer, discontinuous regions and the pattern of the discontinuous regions.

DESCRIPTION OF BACKGROUND ART

The conventional light emitting diode structure includes a growth substrate, an n-type semiconductor layer, a p-type semiconductor layer and a light-emitting layer between the two semiconductor layers. A reflecting layer used for reflecting the light from the light-emitting layer could be formed selectively in this structure. In order to improve at least one of the optical property, the electrical property, and the mechanical property in the light emitting diode, one adequately selected material would be used to substitute the growth substrate as a carrier to carry the structure except for the growth substrate, for example: metal or silicon substrate could be used to replace the sapphire substrate for growing nitride. The growth substrate could be removed by etching, polishing or laser-removing. However, the growth substrate could be also reserved entirely or partly and combined with the carrier. Besides, a transparent oxide could also be integrated in the light emitting diode structure to promote the current spreading.

The applicant disclosed one light-emitting device 100 with high light-emitting efficiency in TW Pat. No. I237903. As shown in FIG. 1, the light-emitting device 100 includes a sapphire substrate 110, a nitride buffer layer 120, an n-type nitride semiconductor stack 130, a nitride light-emitting layer of a multiple quantum-well structure 140, a p-type nitride semiconductor stack 150, and a transparent conductive oxide layer 160. Besides, a plurality of hexagonal-pyramid cavities 1501 formed on the surfaces where the p-type nitride semiconductor stack 150 facing the transparent conductive oxide layer 160. The inner surfaces of the hexagonal-pyramid cavities 1501 are easier to form the ohmic contact region with the transparent conductive oxide layer 160 wherein the material of the transparent conductive oxide layer 160 can be indium tin oxide (ITO), cadmium tin oxide (CTO), antimony tin oxide, indium zinc oxide, zinc aluminum oxide, or zinc tin oxide. Therefore, the forward voltage of the light-emitting device 100 keeps lower and the light-extracting efficiency is also improved by the hexagonal-pyramid cavities 1501.

ITO could be formed on the hexagonal-pyramid cavities 1501 of either or both of the semiconductor stacks by electron beam evaporation or sputtering. ITO with different forming method may show difference in the optical property, electrical property, or both, and the related reference could be referred to Taiwan Application No. 096111705, which is incorporated herein by reference by the same applicant. In FIG. 2, under a scanning electron microscope (SEM), the hexagonal-pyramid cavities 1501 are not fully filled with ITO particles by the electron beam evaporation and a lot of space formed between the particles. The space may confine the light to the light-emitting device and make the light being absorbed by the surrounding ITO gradually. Or there is the medium such as air with the smaller refractive index than that of ITO existing in the space, which may cause the total reflection at the boundary of the materials so the light could not leave the ITO layer and being absorbed by the surrounding ITO gradually.

In addition, C. H. Kuo et al. disclosed the relation between the ITO transmittance and light wavelength in the paper entitled "Nitride-based near-ultraviolet LEDs with an ITO transparent contact" (Materials Science and Engineering B, 2004). When the wavelength is smaller than 420 nm, the ITO transmittance tends to decrease rapidly, and is even lower than 70% when the wavelength is 350 nm. ITO has the transmittance higher than 80% in the blue light wavelength region, but the transmittance in UV or near-UV region is not good enough. Therefore, transparent oxide material such as ITO commonly used in the semiconductor light-emitting device has more space to improve for the performance in optics and electricity.

SUMMARY OF THE DISCLOSURE

An optoelectronic semiconductor device in accordance with an embodiment of present application includes a conversion unit having a first side; an electrical connector; a contact layer having an outer perimeter; and at least three successive discontinuous regions formed along the outer perimeter and having at least one different factor; wherein the electrical connector, the contact layer, and the discontinuous-regions are formed on the first side of the conversion unit.

Optoelectronic semiconductor devices in accordance with other embodiments of present application are disclosed as the following:

The factor in the optoelectronic semiconductor device includes the angle, the length, the width, the depth, or the distance. The contact point in the optoelectronic semiconductor device includes a root part, a branch part and an end part. The contact point in the optoelectronic semiconductor device includes a region connecting to the outer circuit. The contact point in the optoelectronic semiconductor device includes at least one intersection point with the discontinuous regions in one projection direction.

The optoelectronic semiconductor device further includes a current blocking region, which is disposed under at least one of the discontinuous regions. Each discontinuous region in the optoelectronic semiconductor device includes only one opening at the outer perimeter. The discontinuous region in the optoelectronic semiconductor device includes at least one current blocking region.

An optoelectronic semiconductor device in accordance with another embodiment of present application includes a conversion unit; a first electrical connector adjacent to the conversion unit; a second electrical connector constructing one of the two ends of a current channel with the first electrical connector; a contact layer having an outer perimeter; and a plurality of discontinuous regions are formed from the outer perimeter and are substantially conformed with the shape of the electrical connector.

Optoelectronic semiconductor devices in accordance with other embodiments of present application disclose as the following:

The distances from each discontinuous region in the optoelectronic semiconductor to the nearest electrical connector are substantially the same. The first electrical connector and the second electrical connector in the optoelectronic semiconductor device could be on the opposite side of the conversion unit. The first electrical connector and the second electrical connector in the optoelectronic semiconductor device could be on the same side of the conversion unit. The optoelectronic semiconductor device further includes an ohmic contact region disposed under the contact layer, the discontinuous region, or both of them.

At least one of the discontinuous regions in the optoelectronic semiconductor device deviates from the overall variation tendency. At least one of the first electrical connector and the second electrical connector is in bilateral symmetry. At least two of the discontinuous regions in the optoelectronic semiconductor device have a common opening at the outer perimeter.

An optoelectronic semiconductor device in accordance with another embodiment of present application includes a conversion unit having a first side; an electrical connector disposed on one side of the conversion unit; a contact layer having an outer perimeter; and a plurality of discontinuous regions arranged from the outer perimeter toward the electrical connector and presenting an irregular variation in one dimension.

Optoelectronic semiconductor devices in accordance with other embodiments of present invention disclose as the following:

The contact layer and the discontinuous region are disposed between the electrical connector and the conversion unit. The discontinuous region in the optoelectronic semiconductor device has discontinuity in characteristics including at least one of the geometry, the material, the physical property, and the chemical property. The optoelectronic semiconductor device further includes an ohmic contact region disposed under the contact layer, the discontinuous region, or both of them and including a protruding space, a depressive space, or both of them, the geometry of which is at least one of the pyramid, the cone, or the frustum.

An optoelectronic semiconductor device in accordance with an embodiment of present application includes a substrate having an area larger or equal to 45 mil×45 mil; a first electrical connector including: a first root part electrically connecting to two or more end parts; and a second root part separating from the first root part and electrically connecting to two or more end parts; a second electrical connector including at least two root parts and a plurality of end parts; and a conversion unit disposed between the substrate and the second electrical connector; wherein at least one of the end parts from the second electrical connector is existing between any two adjacent end parts from the first electrical connector.

Besides, the embodiment in the application also discloses as the following:

The first root part and the second root part of the first electrical connector connect to each other.

At least one of the first root part and the second root part of the first electrical connector in the optoelectronic semiconductor device electrically connects to at least one of the end parts by at least one branch part.

The second electrical connector in the optoelectronic semiconductor device further includes a branch part including a first end connecting to at least one of the two root parts, a second end, and a trunk connecting to at least one of the end parts.

The optoelectronic semiconductor device further includes a current blocking region which is disposed under the second electrical connector.

The optoelectronic semiconductor device further includes a platform where the first electrical connector is formed.

The optoelectronic semiconductor device further includes a contact layer which is disposed between the second electrical connector and the conversion unit and includes a discontinuous region.

A current channel in accordance with an embodiment of present application provides a current passing through a conversion unit and includes a first electrical connector; and a second electrical connector including at least two root parts and plurality of end parts; wherein the first electrical connector includes a first root part electrically connecting to two or plurality of end parts; a second root part separating from the first root part connects to two or plurality of end parts; and at least one of the end parts of the second electrical connector is existing between any two adjacent end parts of the first electrical connector.

The embodiment in the invention also discloses as the following:

The conversion unit in the current channel includes a first surface and a second surface; the first surface electrically connects to the first electrical connector and the second surface electrically connects to the second electrical connector.

The two root parts of the second electrical connector in the current channel connect to each other.

DETAILED DESCRIPTION OF PREFERRED EMBODIMENTS

The embodiments are described hereinafter in accompany with drawings.

Figure 1:
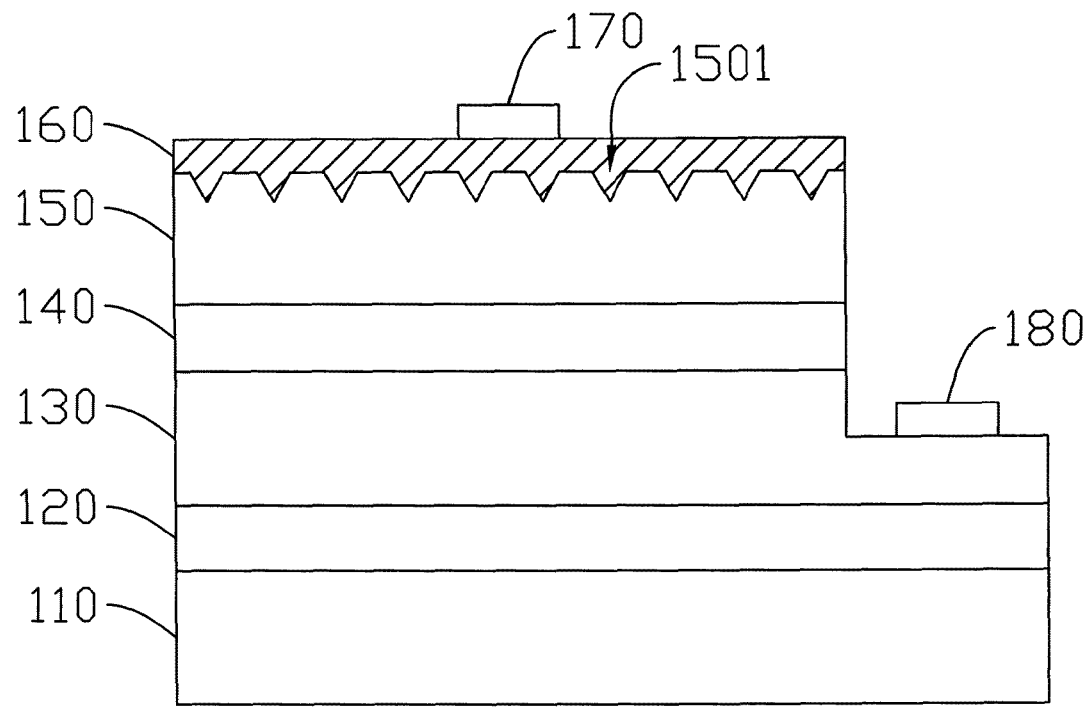
FIG. 1 illustrates a high light-emitting efficiency device disclosed in Taiwan Pat. No. I237903 by the applicant.
Figure 2:
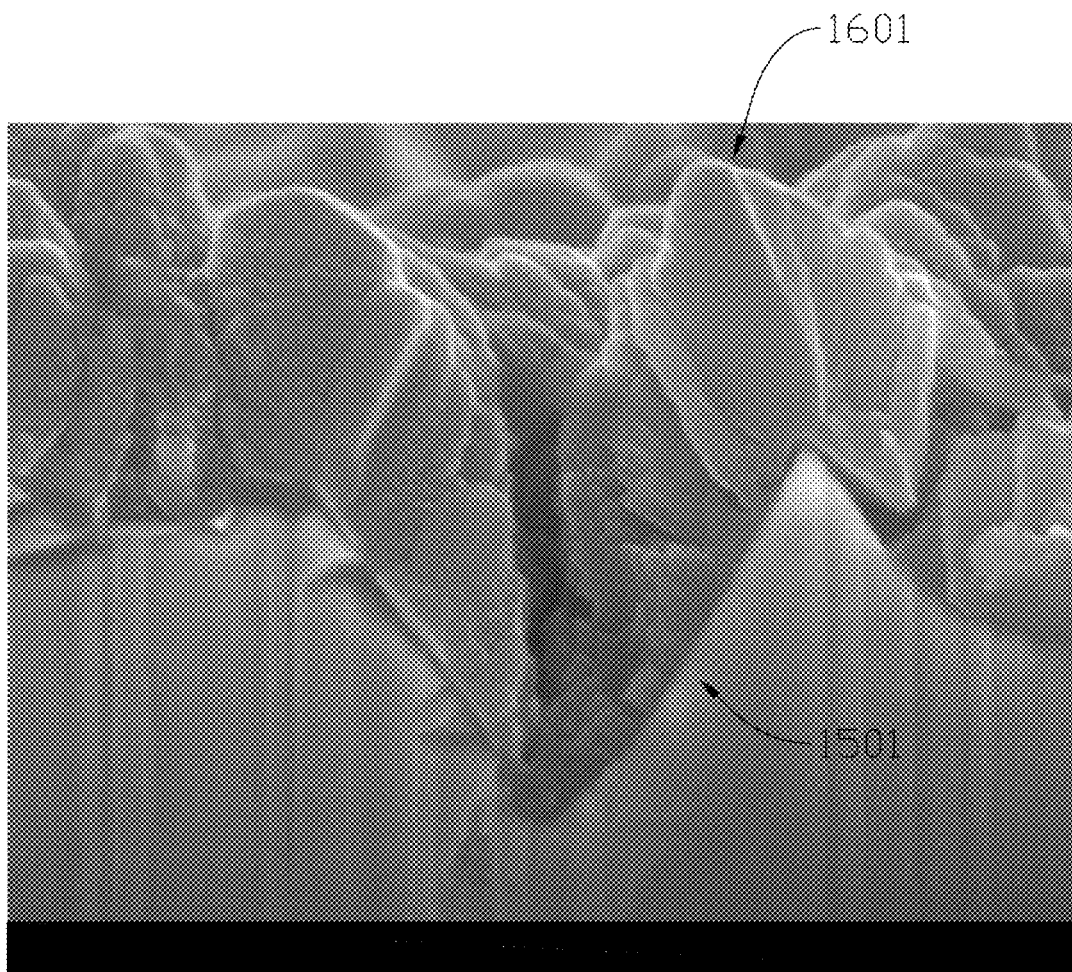
FIG. 2 illustrates a photograph of the ITO particles formed by the electron beam evaporation under the scanning electron microscope.
Figure 3:
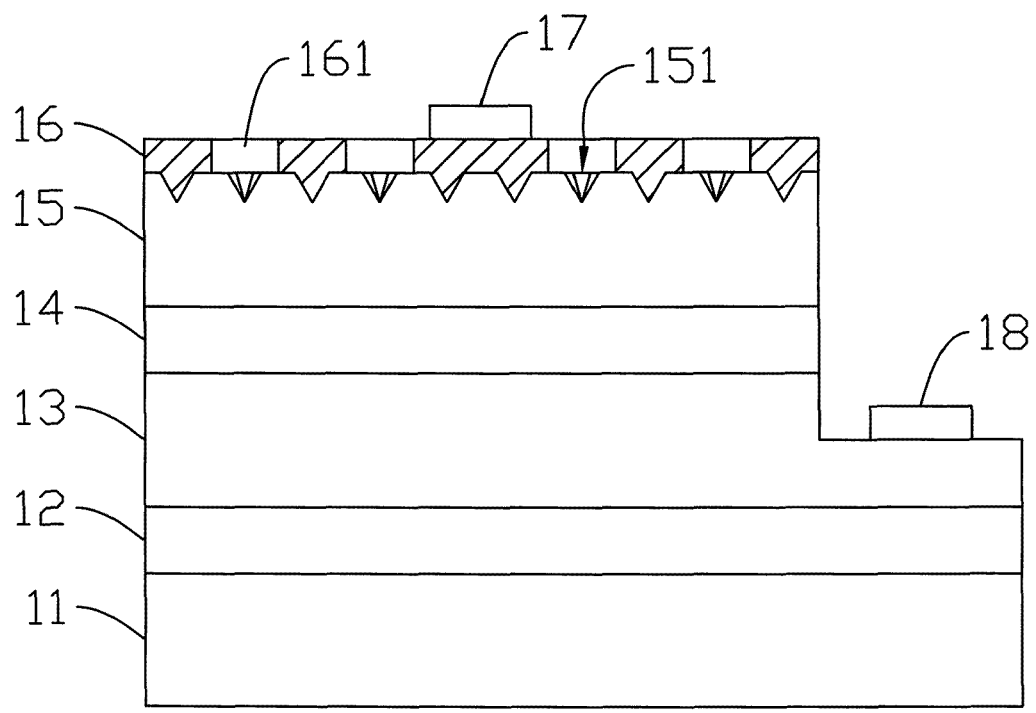
FIG. 3 illustrates a structure of an optoelectronic semiconductor device in accordance with an embodiment of present application.

FIG. 3 illustrates an optoelectronic semiconductor device including a semiconductor system formed on a substrate. A semiconductor system such as a semiconductor device, equipment, product, circuit, or application can proceed or induce the light energy and electrical energy transfer. Specifically speaking, a semiconductor system includes at least one of a light-emitting diode (LED), a laser diode (LD), a solar cell, a liquid crystal display, or an organic light-emitting diode. The phrase "semiconductor system" in the specification does not require that all the sub-systems or units in the system are manufactured by semiconductor materials. Other non-semiconductor materials such as metal, oxide, insulator and so on could also be selectively integrated in this semiconductor system.

In accordance with one embodiment in the application, a semiconductor system includes at least a first conductivity layer 13, a conversion unit 14, and a second conductivity layer 15. The first conductivity layer 13 and the second conductivity layer 15 are two single-layer structures or two multiple layers structure ("multiple layers" means two or more than two layers) having different electrical properties, polarities, dopants for providing electrons or holes respectively. If the first conductivity layer 13 and the second conductivity layer 15 are composed of the semiconductor materials, the conductivity can be composed of any two of p-type, n-type, and i-type. The conversion unit disposed between the first conductivity layer 13 and the second conductivity layer 15 is a region where the light energy and the electrical energy could transfer or could be induced to transfer. Those transferring the electrical energy to the light energy are a light-emitting diode, a liquid crystal display, or an organic light-emitting diode; those transferring the light energy to the electrical energy are a solar cell or an optoelectronic diode.

Taking the light-emitting diode as an example, the transferred light emission spectrum could be adjusted by changing the physical or chemical arrangement of one layer or more layers in the semiconductor system. The commonly used materials are the series of aluminum gallium indium phosphide (AlGaInP), the series of aluminum gallium indium nitride (AlGaInN), the series of zinc oxide (ZnO) and so on. The conversion unit can be a single heterostructure (SH), a double heterostructure (DH), a double-side double heterostructure (DDH), or a multi-quantum well (MWQ). Besides, the wavelength of the emitting light could also be adjusted by changing the number of the pairs of the quantum well.

Substrate 11 is used for growing or carrying the semiconductor system, and the suitable material includes but is not limited to germanium (Ge), gallium arsenide (GaAs), indium phosphide (InP), sapphire, silicon carbide (SiC), silicon (Si), lithium aluminum oxide (LiAlO$_2$), zinc oxide (ZnO), gallium nitride (GaN), aluminum nitride (AlN), glass, composite, diamond, CVD diamond, diamond-like carbon (DLC) and so on.

A transition layer 12 could be optionally formed between the substrate 11 and the semiconductor system. The transition layer 12 between two material systems is a material system transiting the substrate material system to the semiconductor material system. Regarding the structure of the light-emitting diode, on the one hand, the transition layer is the material layer such as the buffer layer and so on used to reduce the lattice mismatch between two material systems. On the other hand, the transition layer could also be a single layer, multiple layers, or a structure to combine two materials or two separated structures where the material can be organic, inorganic, metal, semiconductor and so on, and the structure can be a reflection layer, a heat conduction layer, an electrical conduction layer, an ohmic contact layer, an anti-deformation layer, a stress release layer, a stress adjustment layer, a bonding layer, a wavelength converting layer, a mechanical fixing structure and so on.

A contact layer 16 could also be optionally formed on the second conductivity layer 15. The contact layer is disposed on the side of the second conductivity layer 15 far apart from the conversion unit 14. Specifically speaking, the contact layer could be an optical layer, an electrical layer or the combination of the two. An optical layer could change the electromagnetic radiation or the light from or entering the conversion unit 14. The phrase "change" here means to change at least one optical property of the electromagnetic radiation or the light. The abovementioned property includes but is not limited to the frequency, the wavelength, the intensity, the flux, the efficiency, the color temperature, the rendering index, the light field, and the angle of view. An electrical layer can change or produce the tendency to change at least one of the value, the density, or the distribution of the voltage, the resistance, the current, or the capacitance between any pair of the opposite sides of the contact layer 16. The composition material of the contact layer 16 includes at least one of oxide, conductive oxide, transparent oxide, oxide with 50% or higher transmittance, metal, relatively transparent metal, metal with 50% or higher transmittance, organic material, inorganic material, fluorescent material, phosphorescent material, ceramic, semiconductor, doped semiconductor, and undoped semiconductor. In certain applications, the material of the contact layer is at least one of indium tin oxide (ITO), cadmium tin oxide (CTO), antimony tin oxide, indium zinc oxide, zinc aluminum oxide, and zinc tin oxide. If the material is the relatively transparent metal, the thickness is about 0.005 μm~0.6 μm, 0.005 μm~0.5 μm, 0.005 μm~0.4 μm, 0.005 μm~0.3 μm, 0.005 μm~0.2 μm, 0.2 μm~0.5 μm, 0.3 μm~0.5 μm, 0.4 μm~0.5 μm, 0.2 μm~0.4 μm, or 0.2 μm~0.3 μm.

Figure 4:
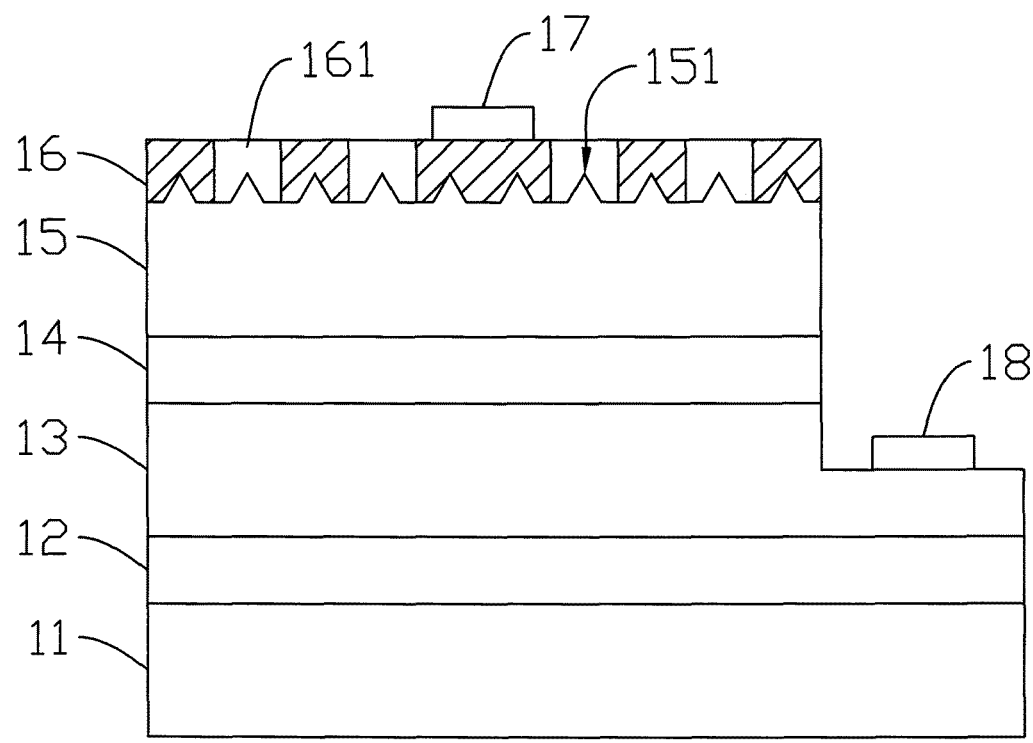
FIG. 4 illustrates a structure of an optoelectronic semiconductor device in accordance with another embodiment of present application.

In some situations, an ohmic contact region 151 can be formed on the second conductivity layer 15. If the second conductivity layer 15 contacts with the contact layer 16 by the ohmic contact region 151 directly or indirectly, an ohmic contact could be formed therebetween, or could decrease at least one of the driving voltage, the threshold voltage, and the forward voltage in the optoelectronic semiconductor device 10. The possible configuration of the ohmic contact region 151 is a protrusion or a depression. The depressed ohmic contact region 151 is shown in FIG. 3, and the protruded ohmic contact region 151 is shown in FIG. 4. The possible geometry of the depressed space is pyramid, cone, frustum, pillar, cylinder, hemisphere, irregularity or any combination thereof. The possible geometry of the protruded space is pyramid, cone, frustum, pillar, cylinder, hemisphere, irregularity or any combination thereof. Besides those composed of single same or similar protrusion or depression as shown in the figures, the ohmic contact region 151 can also be composed of the combination of the protrusions and the depressions. In one embodiment, the protruded space, the depressed space, or both of the two can be of hexagonal-pyramid. At least a part of where the contact layer 16 contacts with the ohmic contact region 151 forms the ohmic contact.

The specific lattice direction or the surface energy level of the inclined surfaces on the pyramid can be one possible reason for forming the ohmic contact or the lower potential energy barrier. In addition, where the parts on the surfaces of the second conductivity layer 15 not formed the ohmic contact region 151 can form a poorer ohmic contact, non-ohmic contact, or schottky contact with the contact layer 16. However, these parts do not exclude the possibility of forming the ohmic contact. The background of forming the ohmic contact and some related embodiments can be referred to TW. Pat. No. I237903, which is incorporated herein by reference by the same applicant.

Besides as a continuous single layer or multiple layers, the contact layer 16 can be a discontinuous or patterned single layer or multiple layers. The related reference can be referred to Taiwan Application No. 096111705, which is incorporated herein by reference by the same applicant. "Discontinuous" herein means at least one of the geometry, material, physical property, and chemical property is discontinuous. The geometric discontinuity means at least one of the length, the thickness, the depth, the width, the period, the outer shape, the inner structure is discontinuous. The discontinuity in material means that at least one of the density, the composition, the concentration, the manufacture method is discontinuous. The discontinuity in physical property means at least one of the electrical property, the optical property, the thermostatic property, the mechanical property is discontinuous. The discontinuity in chemical property means at least one of the dopant material, the activity, the acidity, the alkalinity is discontinuous. As shown in FIGS. 3 and 4, there is a discontinuous region 161 formed on the contact layer 16. If the material is discontinuous, the material in the discontinuous region 161 could not form the ohmic contact with the second conductivity layer 15 and/or the ohmic contact region 151. The optical property of the discontinuous region 161 could be also different from the contact layer 16. The optical property includes the transmittance, the refractive index, or the reflective index. By selecting the adequate material for the discontinuous region 161, the intensity of the light or of the energy flux leaving or entering the conversion unit 14 could be enhanced. For example, if the discontinuous region 161 is the air gap, the light from the conversion unit 14 can leave the semiconductor system 10 from the air gap and not be absorbed by the contact layer 16. If there is the regular pattern, the irregular pattern, the rough pattern, the photonic crystals, or any combination thereof formed on at least one of the first conductivity layer 13, the conversion unit 14, and the second conductivity layer 15, the intensity of the light or of the energy flux leaving or entering the discontinuous region 161 can also be enhanced. As shown in FIGS. 3 and 4, if the second conductivity layer 15 contacting with the discontinuous region 161 has the larger refractive index, the light extracted from the discontinuous region 151 can be enhanced because the ohmic contact region 161 can destroy the total reflection of the light at the refractive surfaces.

If the structure of the optoelectronic semiconductor device 10 is similar to those shown in the FIGS. 3 and 4, a second electrical connector 17 can be optionally formed on the second conductivity layer 15 or on the contact layer 16, and a first electrical connector 18 can be optionally formed on the first conductivity layer 13. The electrical connector can be a single-layer or a multiple-layer structure serving as an interface where the optoelectronic semiconductor device 10 electrically connects to the outer circuit. The electrical connector can be connected to the outer circuit by the wiring or be bonded directly with the outer circuit.

Besides, the electrical connector can also be disposed on the other side of the optoelectronic semiconductor device 10. For example, the first electrical connector 18 can be disposed under or on at least one side of the first conductivity layer 13, the transition layer 12, or the substrate 11. In other words, the first electrical connector 18 and the second electrical connector 17 are disposed on the opposite surfaces or the surfaces which are vertical to each to each other. In another embodiment, the second electrical connector 17 can be disposed on the side surfaces of the second conductivity layer 15. In still another embodiment, the first electrical connector 18, the second electrical connector 17, or both of the two can be disposed on the surfaces or the side surfaces of the first conductivity layer 13, the transition layer 12, or the substrate 11 by a through hole, an insulator or both.

There are some embodiments about the electrical connector, the ohmic contact, and the discontinuous region shown below. Although only the second conductivity layer 15 and the second electrical connector 17 are shown in the figures as examples, it does not restrain the following embodiments from being adopted to the first conductivity layer 13 and the first electrical connector 18, or for any other types of the optoelectronic semiconductor device.

Figure 5:
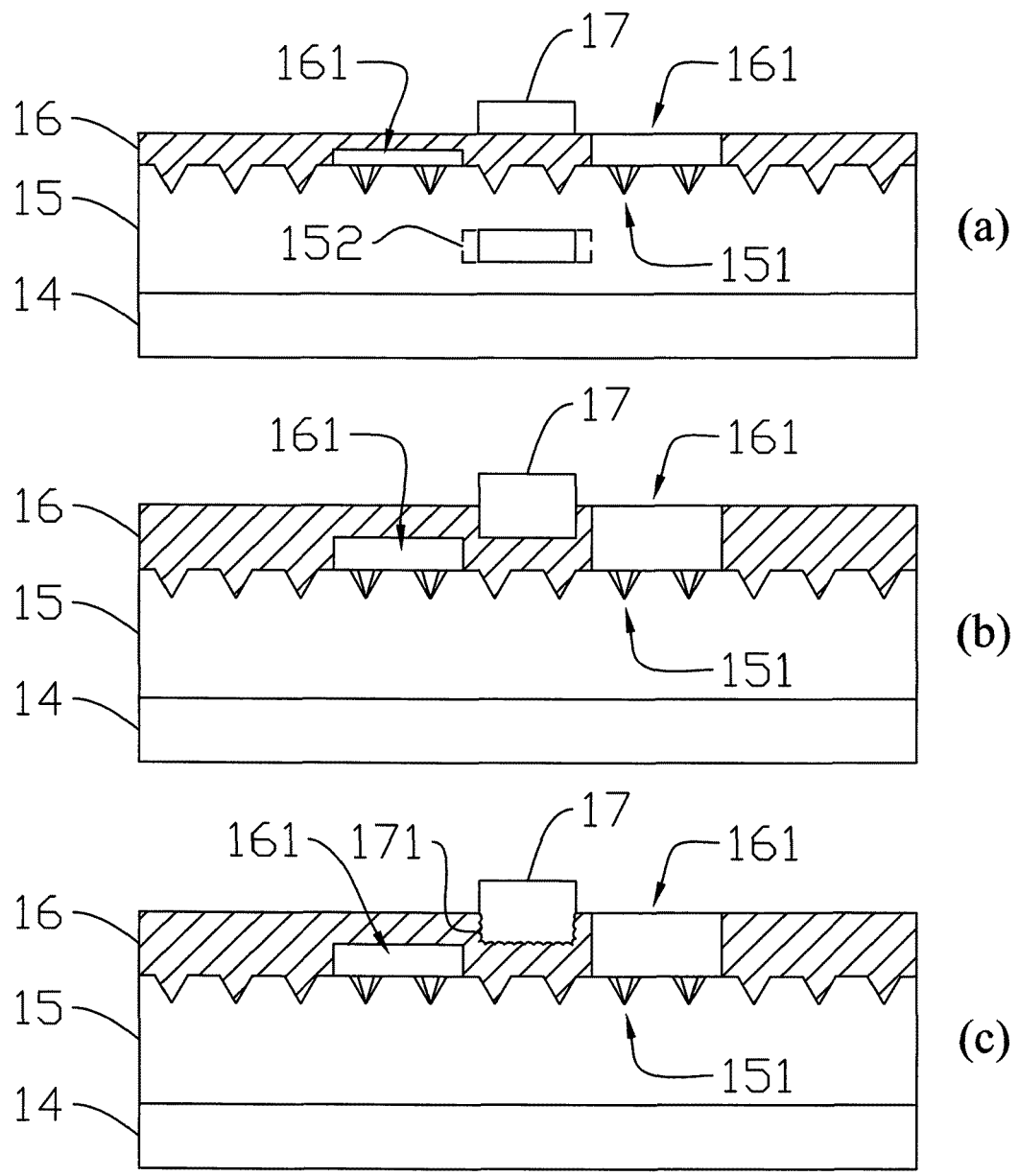
FIG. 5 illustrates a structure of a part of an optoelectronic semiconductor device in accordance with an embodiment of present application.

As shown in FIG. 5, the contact layer 16 is formed on the second conductivity layer 15, the second electrical connector 17 is formed on the contact layer 16, and the discontinuous regions 161 are formed in the surroundings of the second electrical connector 17. The distribution of the discontinuous regions 161 is to let the current from the electrical connector 17 flows laterally to the outer perimeter of the contact layer 16 as far as possible, or keep the percentage change of the current density between the region under the electrical connector 17 and the outer perimeter of contact layer 16 less than 60%, 50%, 40%, 30%, 20%, or 10%. For example, the current density under the electrical connector 17 is x $A/cm^2$, and the current density at the outer perimeter of contact layer 16 is y $A/cm^2$, and the percentage change of the current density is $|x-y|/(x \text{ or } y \text{ which is larger})$ %.

FIG. 5(a) discloses two types of the discontinuous region 161 which can exist individually or simultaneously. The contact layer 16 on the right side of the electrical connector 17 does not overlap with the discontinuous region 161; the contact layer 16 on the left side of the electrical connector 17 overlaps with the discontinuous region 161, and a third medium or structure exists between the contact layer 16 and the second conductivity layer 15. Specifically speaking, the discontinuous region 161 or the third medium or structure is an insulator such as the air or the oxide, a poor conductor comparing with the contact layer, or a Bragg reflector or an anti-reflection layer. Besides, the refractive index of the third medium could be between that of the contact layer 16 and the second conductivity layer 15. At least one of the contact layer 16 that is under the second electrical connector 17, the second conductivity layer 15, the conversion unit 14, the first conductivity layer 13, the transition layer 12, and the substrate 11 can optionally form an insulating region 152 for the current spreading outwards from the second electrical connector 17. The position of the insulating region 152 shown in the figure is only an example, not a limitation. The size of at least one of the contact layer 16 that is under the second electrical connector 17 and the insulating region 152 is equal to or slightly larger than that of the second electrical connector 17. Among which, the size of the contact layer 16 that is under the second electrical connector 17 is the diameter of the smallest fictitious circle of the contact layer 16 located around or under the second electrical connector 17 surrounded by the discontinuous regions 161. As shown in FIG. 5(*b*), the second electrical connector 17 is embedded in the contact layer 16. As shown in FIG. 5(*c*), the second electrical connector 17 is embedded in the contact layer 16, and any surface where the second electrical connector 17 and the contact layer 16 contact with each other forms a regular patterned structure, an irregular patterned structure, or the combination thereof in order to increase the contact area between the second electrical connector 17 and the contact layer 16. For example, there is a rough contact surface 171 between the second electrical connector 17 and the contact layer 16 in order to increase the contact area between each other. The larger contact area can enhance the structure stability of the electrical connector 17 or allow more current pass.

Figure 6:
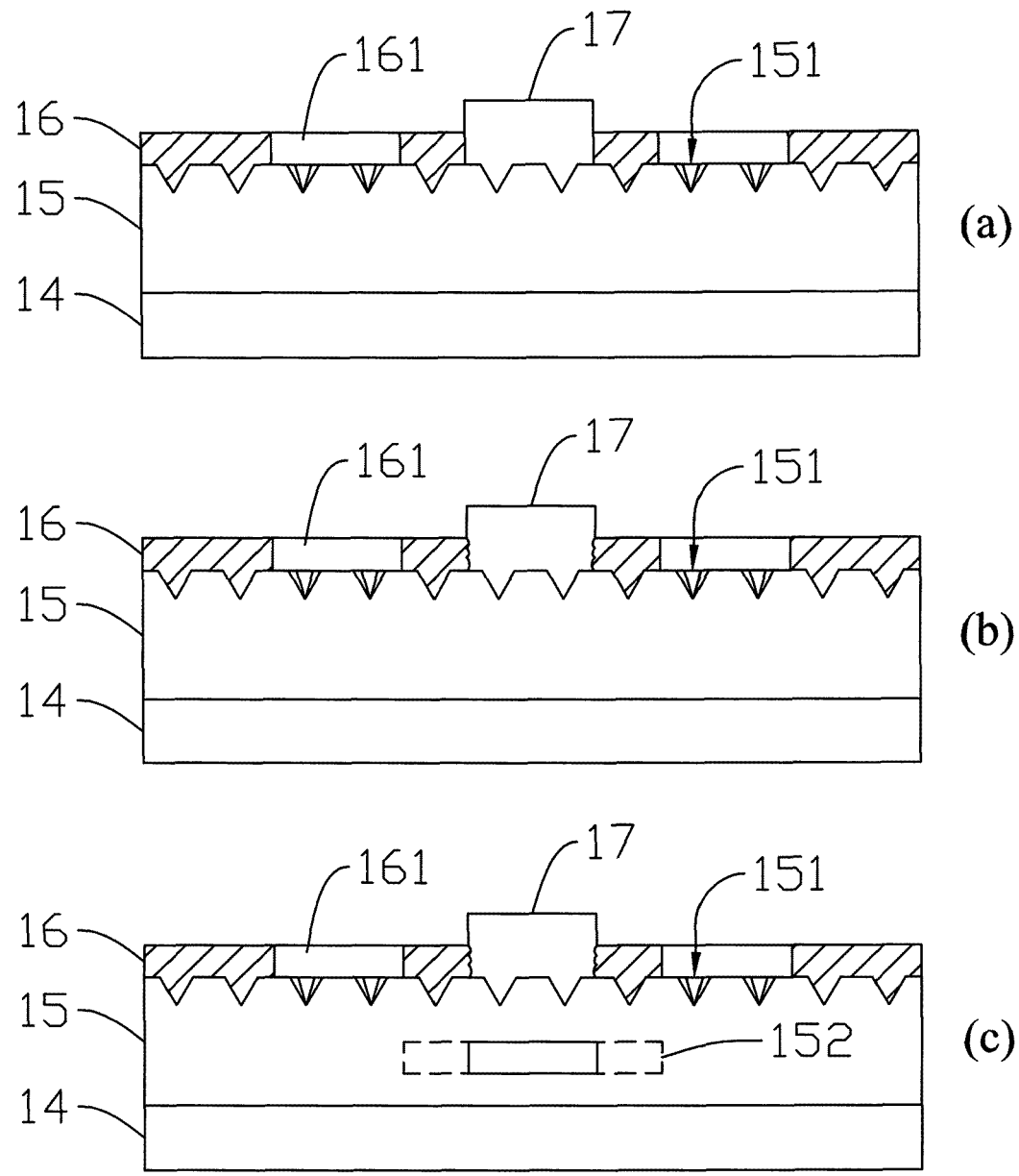
FIG. 6 illustrates a structure of a part of an optoelectronic semiconductor device in accordance with another embodiment of present application.

Another disposition of the electrical connector is disclosed in FIGS. 6(*a*)~6(*c*) and please refer to FIG. 5 to see the disposition or the description of the discontinuous region 161. The second electrical connector 17 is formed on the second conductivity layer 15 directly, in other words, there is no contact layer 16 between the second electrical connector 17 and the second conductivity layer 15. Any surface where the second electrical connector 17 contact with the contact layer 16, the second conductivity layer 15, or both of the two has a regular patterned structure, an irregular patterned structure, or the combination thereof in order to increase the contact area between the second electrical connector 17 and the other part. The larger contact area can enhance the structure stability of the electrical connector 17 or allow more current pass. An insulating region 152 can be formed under the second electrical connector 17. The size of the insulating region 152 is equal to or slightly larger than that of the second electrical connector 17.

Figure 7:
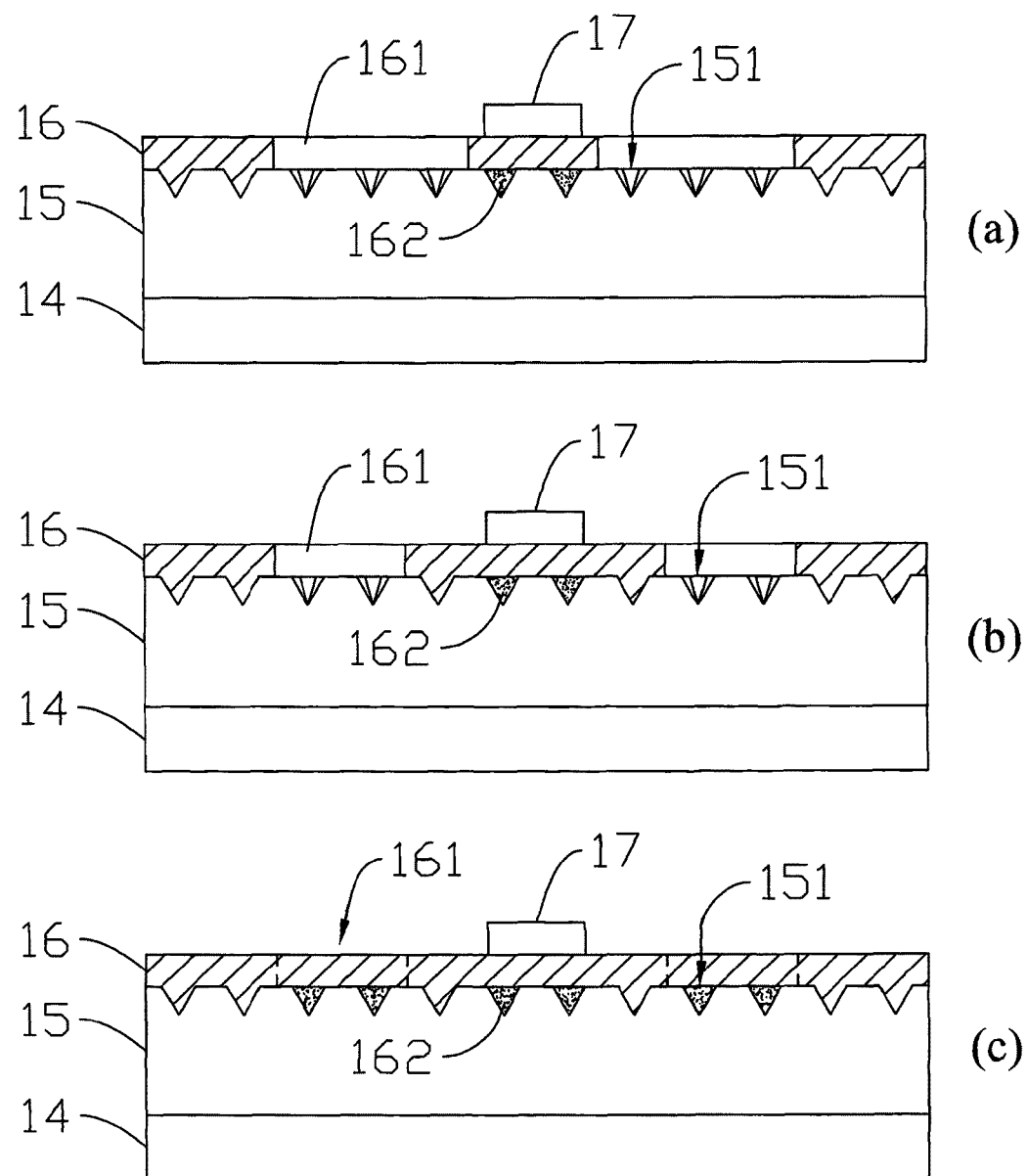
FIG. 7 illustrates a structure of a part of an optoelectronic semiconductor device in accordance with another embodiment of present invention.

An optoelectronic semiconductor device in accordance with another embodiment of this application is disclosed in FIG. 7. In this embodiment, filling material 162 fills in at least part of the space of one or more ohmic contact regions 151. The optical property, the electrical property, or both of the two properties of the electromagnetic radiation or the light could be changed by adjusting the distribution of the filling material 162 in the ohmic contact region 151. The filling material can be at least one of insulator, metal, semiconductor, doped semiconductor, and wavelength conversion material. The insulator can be oxide, inert gas, air and so on. The wavelength conversion material can be fluorescent, phosphorescent, dye, semiconductor and so on. The refractive index of the filling material could be between those of the materials which are on and under it. If the filling materials are particles, the sizes of such should be able to be filled in the ohmic contact region 151 or be smaller in the depth, in the width or in both of it of the ohmic contact region 151. In FIG. 7(*a*), all of the ohmic contact regions 151 that contact with the contact layer 16 and is under the second electrical connector 17 are filled with the filling materials 162. In FIG. 7(*b*), some of the ohmic contact regions 151 that contact with the contact layer 16 and is under the second electrical connector 17 are filled with the filling materials 162, and the filling material 162 does not exist in the ohmic contact regions 151 disposed in other area. As shown in the figure, the outer perimeter of the contact layer 16 is extended into the ohmic contact region 151. In FIG. 7(*c*), the discontinuous regions 161 (shown as dotted line) include the same material as the contact layer 16 and further include the filling material 162.

Figure 8:
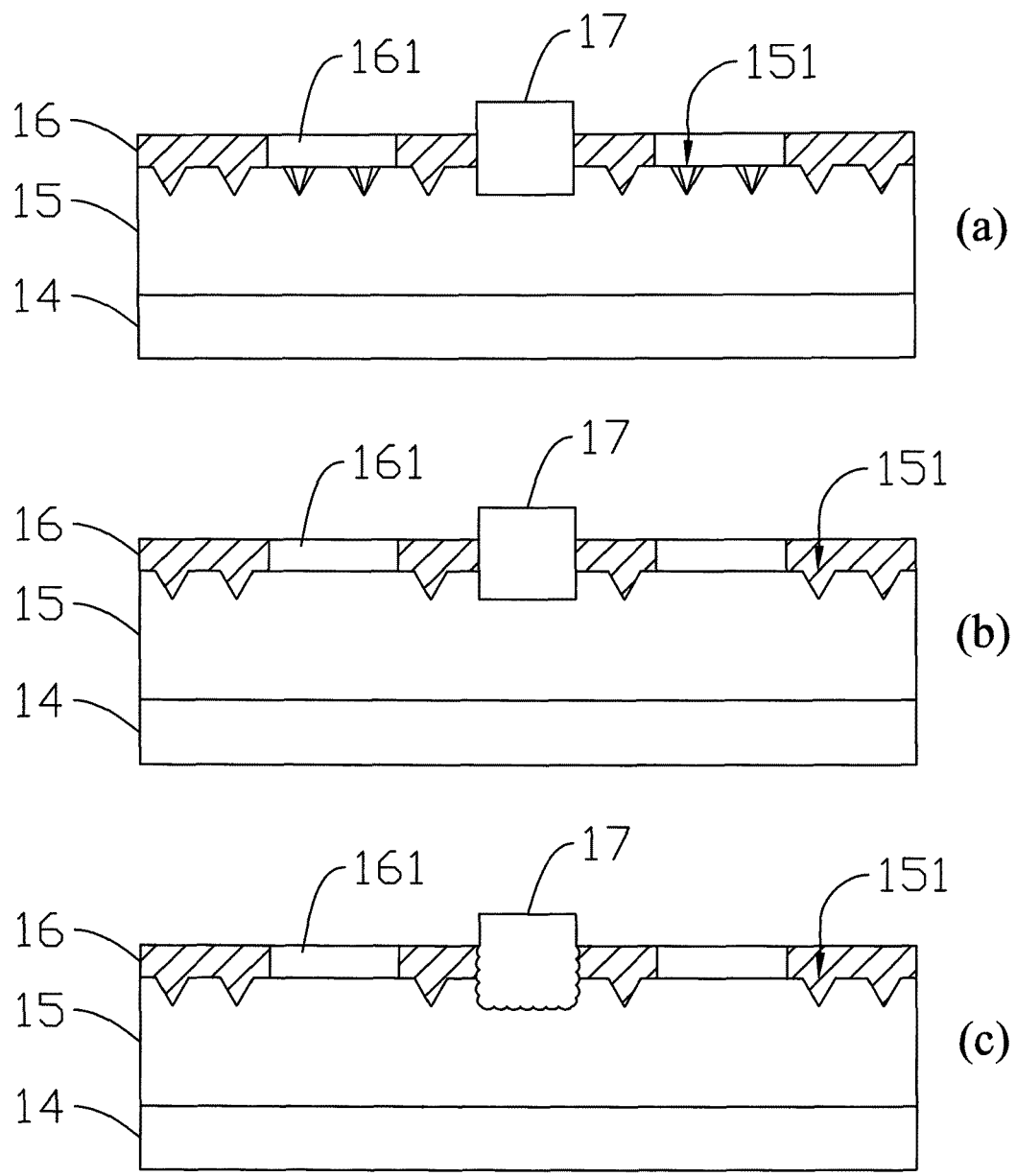
FIG. 8 illustrates a structure of a part of an optoelectronic semiconductor device in accordance with another embodiment of present application.

As shown in FIG. 8, at least a part of the electrical connector 17 is embedded in the second conductivity layer 15. In FIG. 8 (*a*), an ohmic contact region 151, a regular patterned structure (not shown), an irregular patterned structure (not shown), or the combination thereof can be optionally formed under the discontinuous regions 161. In FIG. 8 (*b*), there is no ohmic contact region 151 under the discontinuous region 161. If the ohmic contact region 151 is formed on the second conductivity layer 15 by epitaxial growth, the ohmic contact region 151 in the discontinuous region 161 could be flattened by filling in the filling material 162 (not shown). If the ohmic contact region 151 is formed on the second conductivity layer 15 by wet etching, dry etching, or both of the two methods, an etch mask can be deposited on the region where the discontinuous region 161 is expected to be formed to shield the surface of the second conductivity layer 15 from being etched. In FIG. 8 (*c*), any surfaces where the second electrical connector 17 contacts with the contact layer 16, the second conductivity layer 15, or both of the two can be a regular patterned structure, an irregular patterned structure, or the combination thereof in order to increase the contact area between the second electrical connector 17 and the other part.

Figure 9:
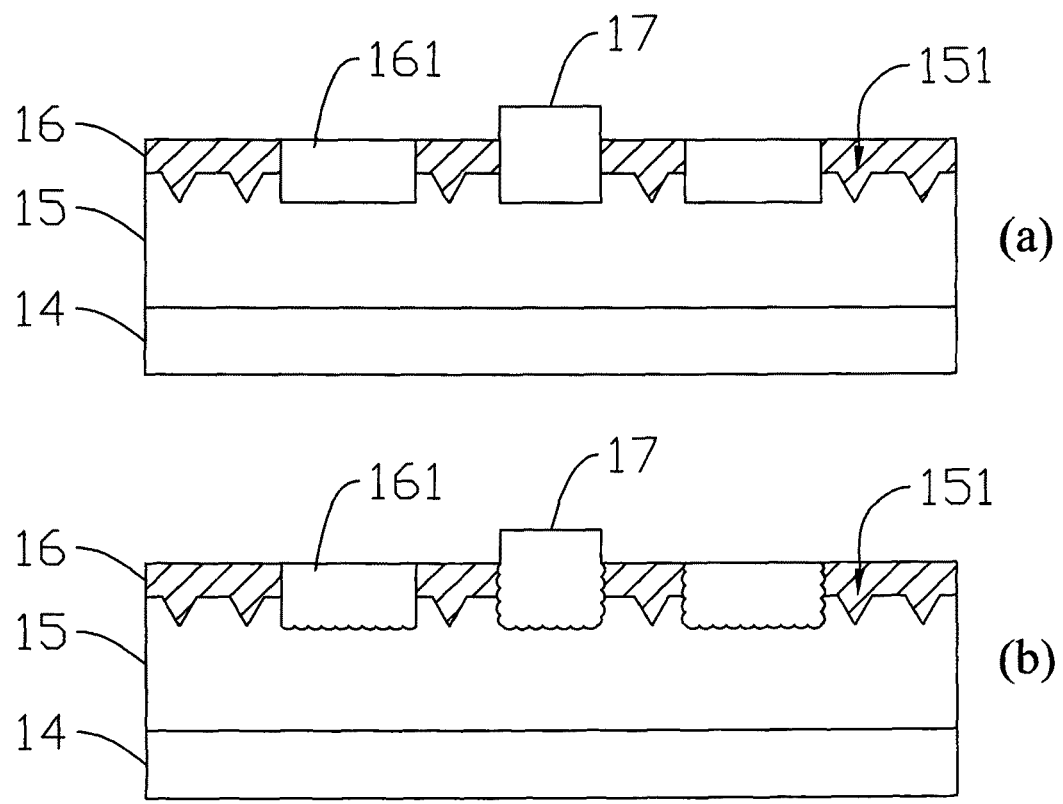
FIG. 9 illustrates a structure of a part of an optoelectronic semiconductor device in accordance with another embodiment of present application.

As shown in FIG. 9, at least a part of the electrical connector 17 is embedded in the second conductivity layer 15 and there is no ohmic contact region 151 under the discontinuous region 161. In one embodiment, first, the contact layer 16 is formed on the upper surfaces of the second conductivity layer 15 where the ohmic contact region 151 is formed. And then, part of the contact layer 16 in accordance with the predetermined pattern is removed until most of the ohmic contact region 151 in the part is almost removed as well. Accordingly, the formation of the discontinuous region 161 and the removal of the ohmic contact region 151 are combined into one series of the manufacture processes. In another embodiment, as shown in FIG. 9 (*b*), any inner surfaces of the discontinuous region 161 can be the regular patterned structure, the irregular patterned structure, or the combination thereof. Any surfaces where the second electrical connector 17 contacts with the contact layer 16, the second conductivity layer 15, or both of the two can be a regular patterned structure, an irregular patterned structure, or the combination thereof in order to increase the contact area between the second electrical connector 17 and the other part.

Figure 10:
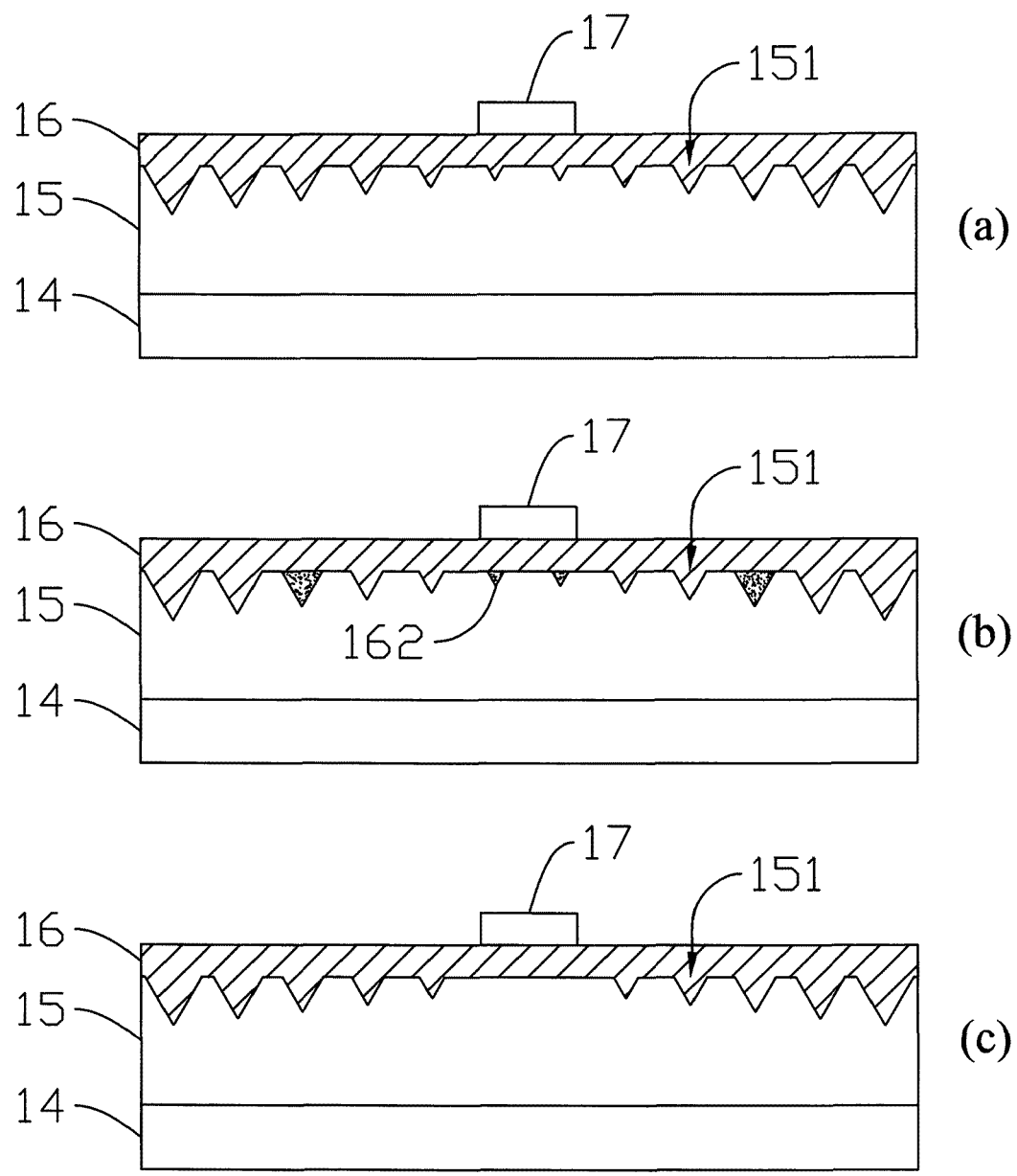
FIG. 10 illustrates a structure of a part of an optoelectronic semiconductor device in accordance with another embodiment of present application.

As shown in FIG. 10, the ohmic contact region 151 is formed on the second conductivity layer 15 in different sizes, and the types of the ohmic contact region 151 can be referred to the before-mentioned description. In some conditions, the quality and the quantity of the ohmic contact between the contact layer 16 and second conductivity layer 15 depend on the conditions of the inner surfaces or the outer surfaces of the ohmic contact region 151. For example, a larger surface can provide more area for the ohmic contact formation. In FIG. 10 (a), the width and the depth of the ohmic contact region 151 are enlarged gradually outward from the electrical connector 17. In FIG. 10 (b), the ohmic contact region 151 under the electrical connector 17 and the specific position is filled with the filling material 162, and the description about the filling material 162 can be referred to the specification and the drawing mentioned above. In FIG. 10 (c), there is no ohmic contact region 151 formed under the electrical connector 17. Herein, the "size" includes but is not limited to length, width, depth, height, thickness, radius, angle, curvature, pitch, area, or volume.

The figures mentioned above are only the illustrations for the embodiments, but not used to limit the forming position, the amounts, or the style of the surface pattern. "Regular patterned structure" is a kind of structure, which has a repeated characteristic that can be identified in any directions on a surface wherein the characteristic can be repeated in a constant periodicity, a variable periodicity, a quasiperiodicity, or the combination thereof. "Irregular patterned structure" is a kind of structure, which has no repeated characteristic that can be identified in any directions on a surface and therefore the structure could also be named after "randomly rough surface".

Figure 11:
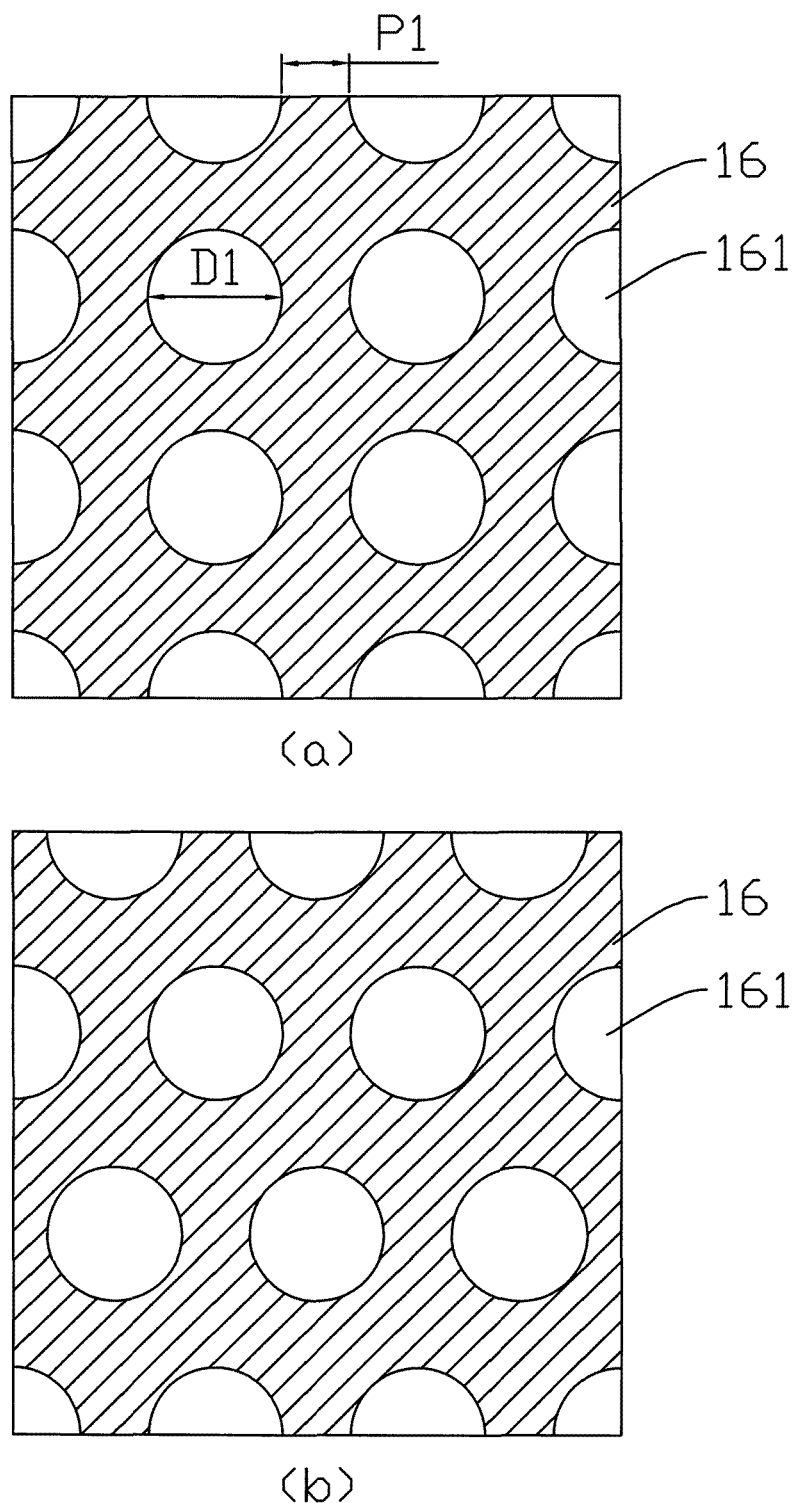
FIG. 11 illustrates a top view of a part of an optoelectronic semiconductor device in accordance with an embodiment of present application.
Figure 12:
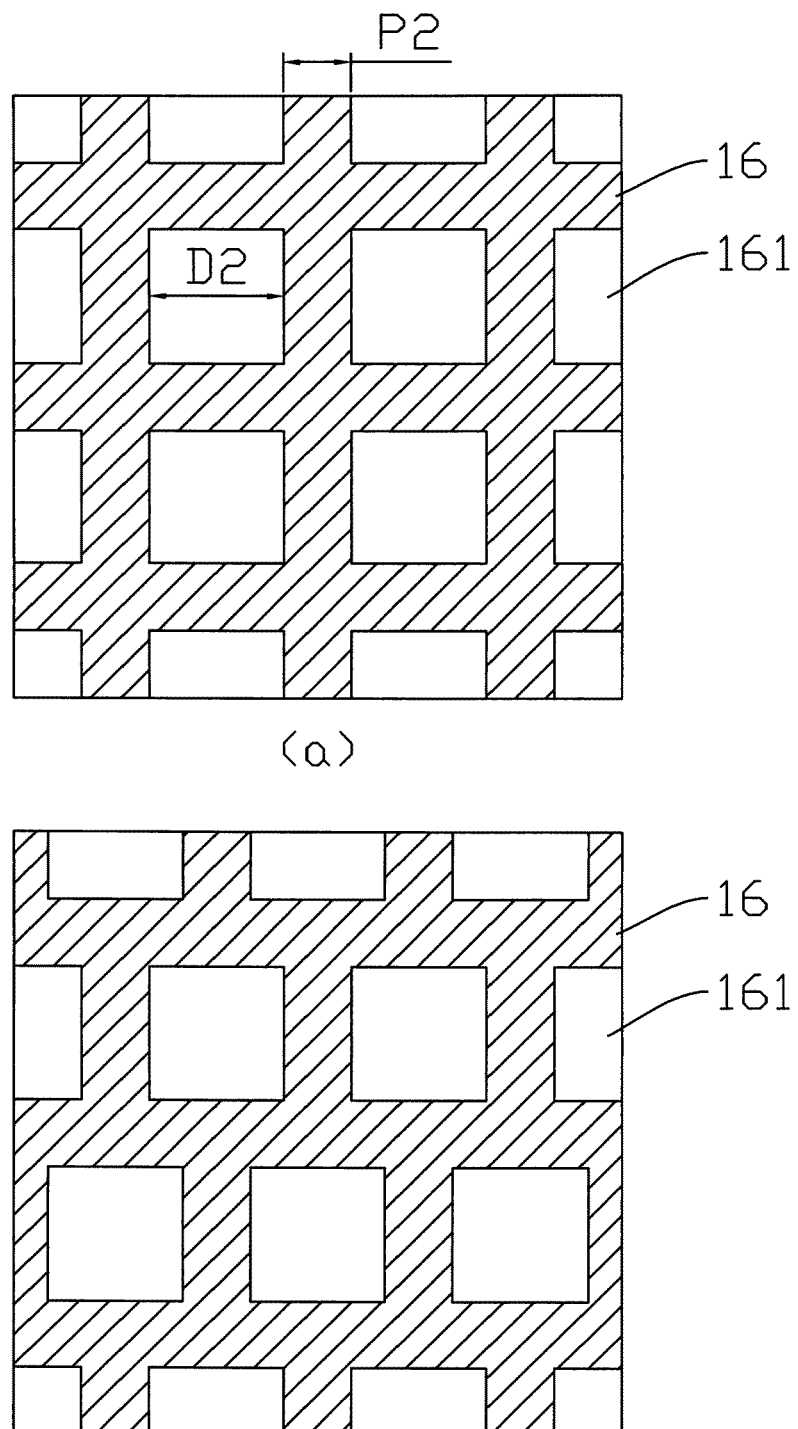
FIG. 12 illustrates a top view of a part of an optoelectronic semiconductor device in accordance with another embodiment of present application.

FIG. 11 and FIG. 12 disclose a part of the top view of the optoelectronic semiconductor device. In FIG. 11, the discontinuous region 161 has a shape of circle and can be disposed in a regular array as shown in FIG. 11 (a), or in an interlaced array as shown in FIG. 11 (b). Symbol P1 indicates the pitch between the circles and symbol D1 indicates the diameter of the circle. In FIG. 12, the discontinuous region 161 has a shape of squares and can be disposed in a regular array as shown in FIG. (a), or in an interlaced array as shown in FIG. (b). Symbol P2 indicates the pitch between the squares and symbol D2 indicates the side length of the square. However, the discontinuous region 161 is not limited to these two shapes. Other shapes such as the rectangle, the rhombus, the parallelogram, the oblong, the triangle, the pentagon, the hexagon, the trapezoid, or the irregularity can also be adopted.

Table 1 is a summary of some results of the experiments. These experiments adopt the blue 45 mil×45 mil chips produced by Epistar Corporation in Taiwan, and the structures of the chips are similar to the optoelectronic semiconductor device 10 shown in FIG. 3 which is further processed to form the discontinuous region and the contact layer such as FIGS. 11(a), 11(b), and 12(a) thereon, in other words, to form the circular regular array, the circular interlaced array, and the square regular array thereon. The material of the contact layer 16 is ITO formed by the electron beam evaporation, the size of the particle is about 50 nm~80 nm, and the refractive index is about 2. The unit of D1, D2, P1 and P2 is μm. $V_f$ is the forward voltage. The ratio of the area is the percentage the area of the contact layer to the total area of the discontinuous area. As Table 1 indicates, the area of the discontinuous area should be adjusted appropriately to improve the brightness and to lower the $V_f$. Besides, the density the discontinuous region in the contact layer is also an adjustable parameter. X. Guo et al. disclosed a method to calculate the distance the current dispersed between two electrodes (Ls) in the journal *Applied Physics Letters*, Vol. 78, No. 21, p. 3337, which is incorporated herein by reference. According to the reference, hypothetically speaking, if the size of the discontinuous region is in the range of the current dispersion, the current could enter the second conductivity region and the contact layer by leaping over a discontinuous region. Accordingly, the current could disperse farther in the contact layer.

TABLE 1

| Array Style | D1 * P1<br>D2 * P2 | Average Brightness<br>Enhancement<br>Ratio (%) | Vf<br>Enhancement | Area<br>Ratio<br>(%) |
|---|---|---|---|---|
| Circular | 16 * 4 | 2.30 | 0.10 | 50.24 |
| Regular Array | 5.5 * 4.5 | 3.50 | 0.03 | 23.75 |
|  | 11 * 9 | 6.11 | 0.06 | 23.75 |
|  | 16 * 9 | 6.06 | 0.03 | 32.15 |
| Circular | 9 * 3 | 1.70 | 0.11 | 52.99 |
| Interlaced<br>Array | 3.5 * 2.5 | 7.60 | 0.04 | 30.85 |
| Square | 16 * 4 | −0.70 | 0.19 | 64.00 |
| Regular Array | 15 * 5 | −2.04 | 0.11 | 56.25 |
|  | 10 * 5 | −3.06 | 0.02 | 44.44 |

The top views of the optoelectronic semiconductor device 10 or the contact layer 16 for some other embodiments are shown in FIGS. 13~18. The symbol 153 indicates a platform. However, the design, the amount, or the scale in the figures is only for exemplary purpose and should not be a limitation of the present application. Other standards, principles, bases, indications, or teachings in accordance with this description can also be applied in the present application.

Figure 13:
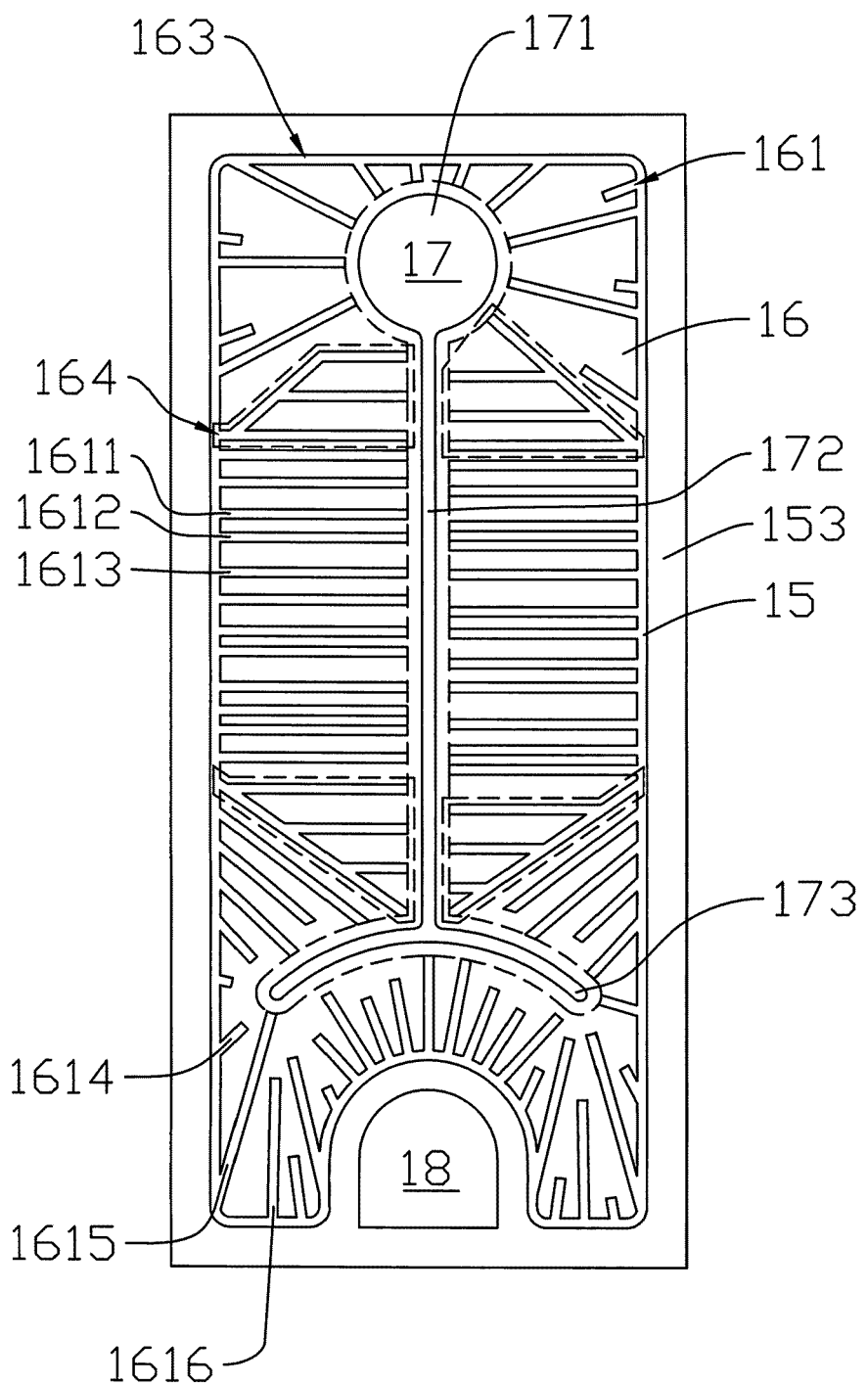
FIG. 13 illustrates a top view of a contact layer of an optoelectronic semiconductor device in accordance with an embodiment of present application.

In FIG. 13, the second electrical connector 17 includes the root part 171, the branch part 172, and the end part 173 forming a current network to lead the current to flow toward the predetermined direction. The root part 171 is the origin of the branch part 172 and the end part 173 in appearance and is usually the remarkable part. Therefore, the root part 171 can be a checkpoint for the manufacture process or the inspection process, and is surely a point to connect to the outer circuit. The end part 173 is the end of the network without branches extending further. The branch part 172 is between the root part 171 and the end part 173. Any two parts electrically connect to or optionally physically connect to each other. For example, any two parts can connect to each other by the outer conducting wire, the contact layer 16, the discontinuous region 161, the intermedium, or the underlying region. Among all, the "intermedium" indicates the material in the space between two adjacent parts formed either in a manufacture process different from the processes of forming the parts or formed by the material at least partly different from the material of one part; the "underlying region" indicates a contact region or a conductivity layer which can be a current channel under any one of the three parts such as the second conductivity layer 15 or the highly doped region.

In one embodiment, the second electrical connector 17 includes only the root part 171 and the end part 173. In other embodiments, each root part 171, branch part 172, and end part 173 can connect to the underlying region by same or different methods, and the connecting method can refer to the embodiments and the drawings shown above. Besides, a current blocking region can be formed optionally under each part to hinder the current from flowing downward or to adjust the way the current spreading downward. The current blocking region achieves the above-mentioned effect by disposing an insulating material or a poor conductive material under the targeted region. In the figures, the amount, the shape, and the style of the root part 171, the branch part 172, and the end part 173 is only for exemplary purpose and should not be a limitation of the present application. For example, the second electrical connector 17 can include two or more root parts 171, or the branch part 172, the end part 173, or the combination thereof can be optionally formed among the root parts 171. A root part 171 can be surrounded by two or more branch parts 172 or end parts 173. A branch part 172 can diverge to two or more end parts 173.

The discontinuous regions 161 are formed inward from the outer perimeter 163 of the contact layer 16, and these discontinuous regions 161 do not pass through the contact layer 16, namely, every discontinuous region has only one opening 164 at the outer perimeter 163 of the contact layer 16 and two or more discontinuous regions 161 sharing one common opening 164 as shown in the dotted region. Seeing from the top view, the discontinuous regions 161 could intersect or not intersect (not shown) the second electrical connector 17. If the discontinuous region 161 intersecting second electrical connector 17 is composed of the insulator or the poor conductor, the intersected discontinuous region 161 can be integrated with the above-mentioned current blocking region, shown in the hatched region in FIG. 14. The position and the size of the current blocking region 165 shown in the figure are only for exemplary purpose and should not be a limitation of the present application.

Figure 14:
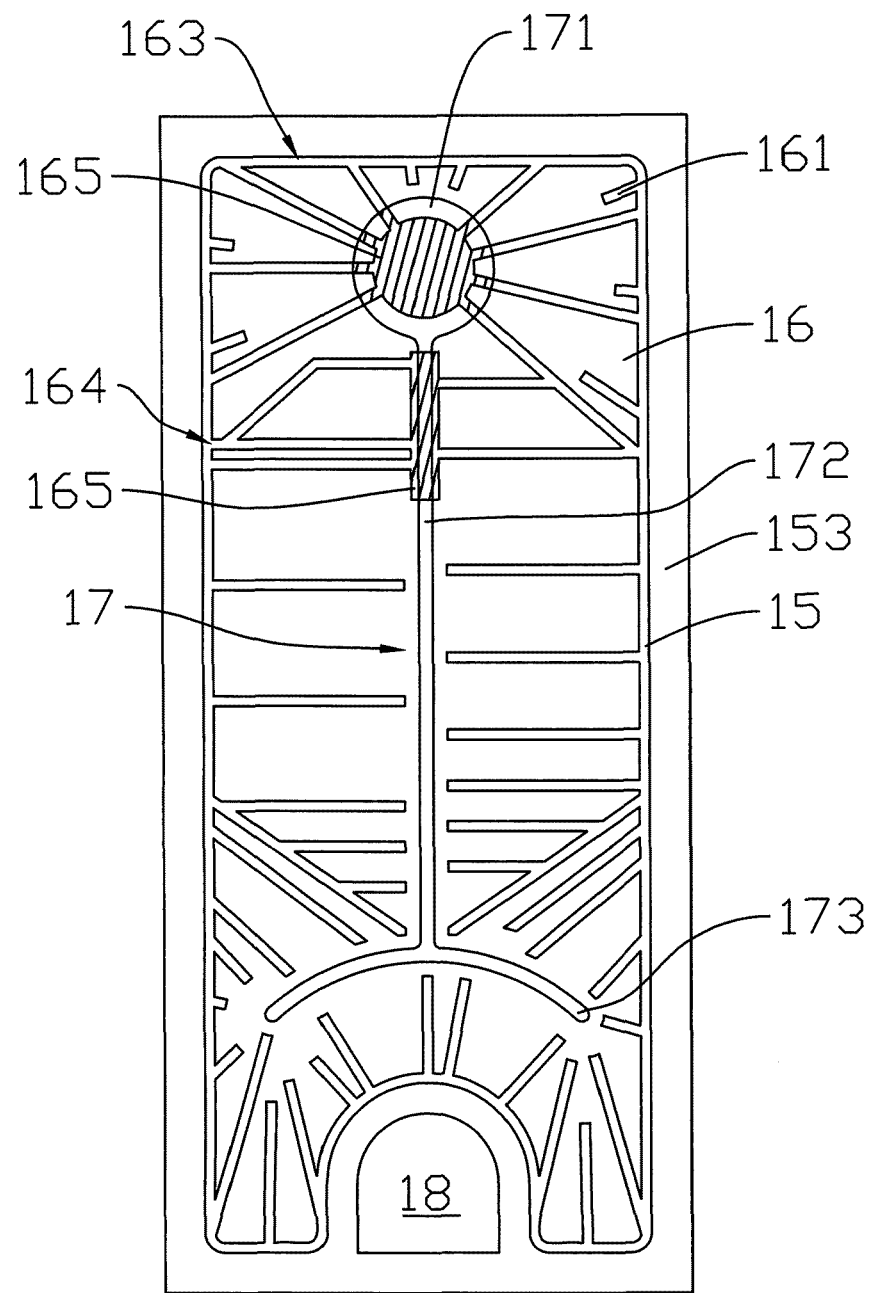
FIG. 14 illustrates a top view of a contact layer of an optoelectronic semiconductor device in accordance with another embodiment of present application.
Figure 15:
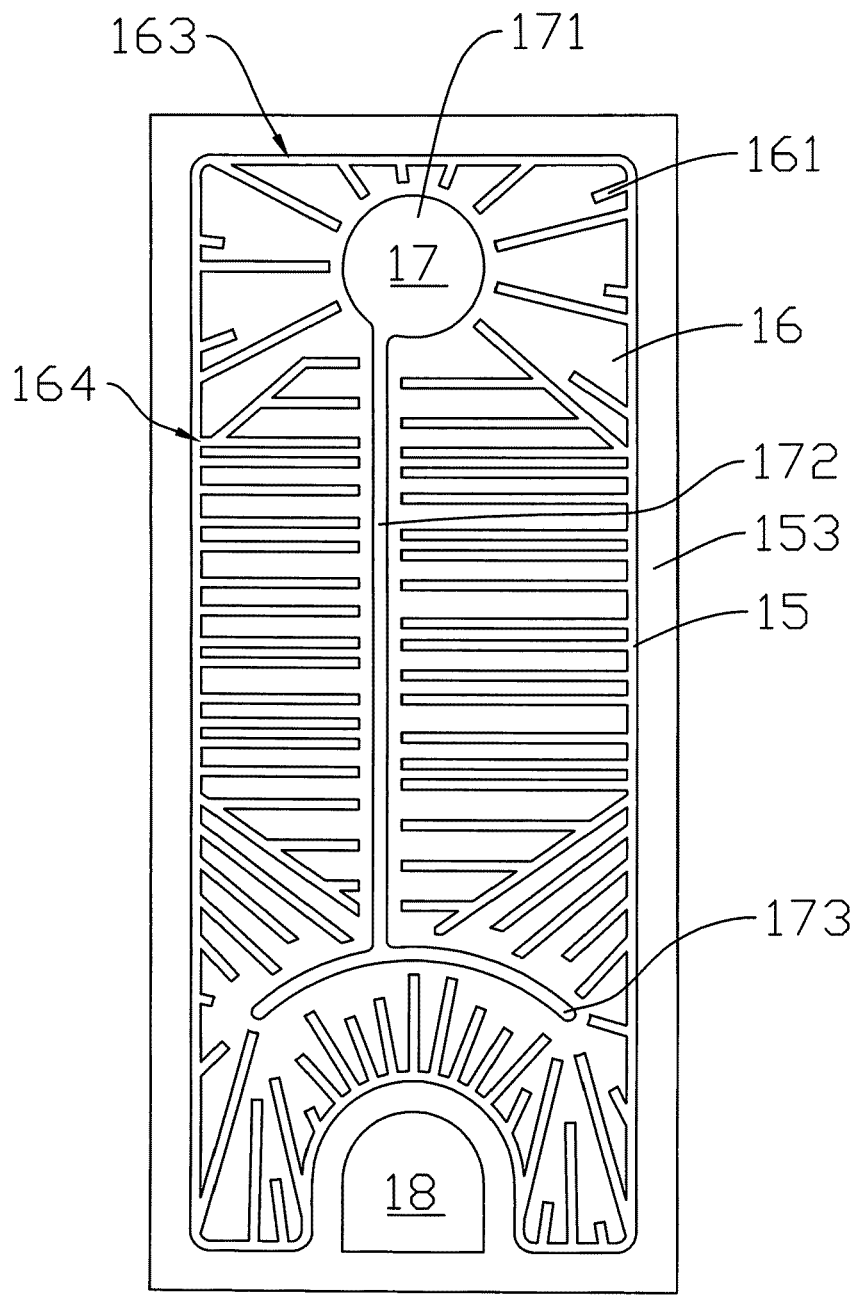
FIG. 15 illustrates a top view of a contact layer of an optoelectronic semiconductor device in accordance with another embodiment of present application.

In one embodiment, at least three discontinuous regions 161 along any or partial range of the outer perimeter 163 are different in at least one element like the angle, the length, the width, the depth, or the pitch. As shown in FIG. 13, discontinuous regions 1611, 1612, and 1613 have the same angle, length, and width, but have different pitches. In other words, without considering the depth, the arrangement of the discontinuous regions 161 in this area presents an irregular variation in one dimension. The irregular variation includes the irregular variation partly or totally, for example, an irregular variation region between two regular variation regions. "Regular variation" indicates that the variation is a geometric variation or an arithmetic variation. In addition, the discontinuous regions 1614, 1615, and 1616 could also have different angles, lengths, widths, or pitches In FIGS. 13 and 14, the second electrical connector 17 is bilateral symmetry. In FIG. 15, the second electrical connector 17 is asymmetry. In FIGS. 13~15, the first electrical connector 18 is bilateral symmetry for exemplary purpose, in other words, the first electrical connector 18 could also be asymmetric. In one embodiment, the total variation tendency of the discontinuous regions 161 follows the shape of the second electrical connector 17 while it is possible that a few discontinuous regions 161 deviate from that variation tendency. For example, one of the two discontinuous regions 161 surrounding the root part 171 or the end part 173 has a shorter length. In another embodiment, at least some of the discontinuous regions 161 have about the same or a stable interval between the second electrical connector 17. For example, the discontinuous regions 161 arranged at the two sides of the branch part 172 have about the same interval with the branch part 172, namely, the value of the pitch is under the reasonable tolerance of the manufacture process.

Figure 16:
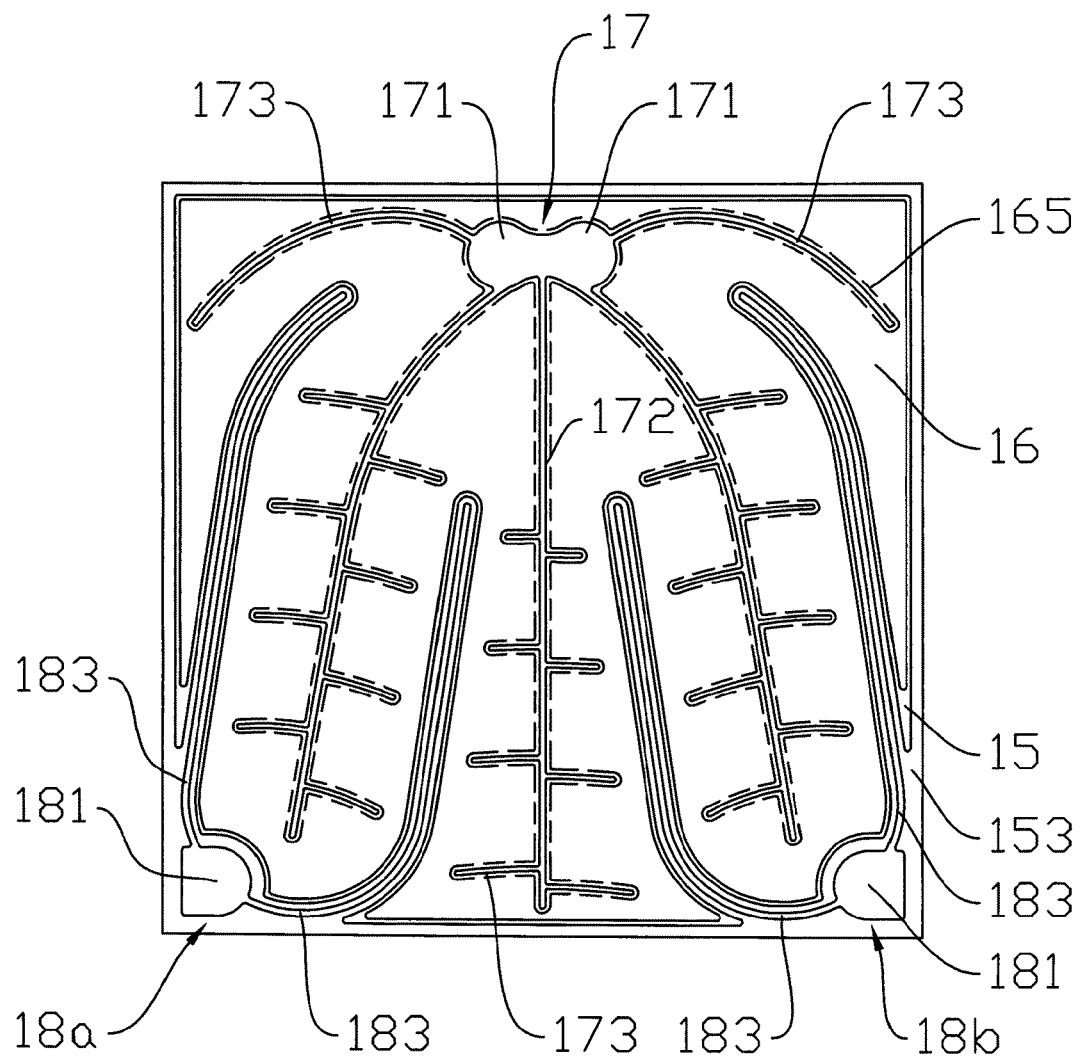
FIG. 16 illustrates a top view of an optoelectronic semiconductor device in accordance with an embodiment of present application.

The top view of the optoelectronic semiconductor device 10 shown in FIG. 16 discloses a first electrical connector 18a, a first electrical connector 18b, and a second electrical connector 17. The first electrical connectors 18a and 18b are formed on the platform 153 and include one root part 181 and two end parts 183. Each root part 181 is adjacent to one of the corners of the platform 153 respectively. The second electrical connector 17 is formed on the contact layer 16 and includes two adjacent root parts 171 and several end parts 173. Among which, two end parts 173 connect to the root parts 171 directly; the other end parts 173 connect to the three branch parts 172 respectively. The first electrical connectors 18a and 18b are physically separated with each other while interdigitating with the second electrical connector 17 respectively. Specifically speaking, each end part 183 of the first electrical connectors 18a and 18b is formed on the platform 153, extending toward the root part 171 of the second connector 17, and entering the region between the branch part 172 and the end part 173, the branch part 172 and the branch part 172, or the end part 173 and the end part 173. However, the amount of the parts in the figure is only for exemplary purpose and should not be a limitation to the present application.

The physical separation of the first electrical connector 18a and 18b makes the arrangement of the electrical connectors more flexible. For example, the first electrical connector 18a and 18b can be disposed on the platforms 153 with different height or in different directions, or can be without the connecting branch parts 172, the connecting end parts 173, or both of them between two electrical connectors. If at least one of the root part 171, the branch part 172, the end part 173 is composed of a material which can shield or consume the light energy entering or leaving the optoelectronic semiconductor device 10, the operating efficiency of the optoelectronic semiconductor device 10 can be improved by reducing the amount of the material. Besides, although the first electrical connector 18a and 18b in the figures form a current channel with the second electrical connector 17 in a bilateral symmetrical form, it is not a limitation to present application. The first electrical connector also can be in radial symmetry or in asymmetry.

The overall pattern or the partial pattern of the first electrical connector 18 and the second electrical connector 17 can be artificial; can resemble the natural creature or the natural phenomenon such as the pattern of the veins of the leaf or the wings of an insect, or one specific mathematic function like fractal. Although the first electrical connector 18a and 18b in the drawings include only the end parts 183, it is not a limitation to this present application, namely, at least one of the first electrical connector 18a and 18b could also include the branch part (not shown). In one embodiment, if there is larger distance or area between two adjacent parts of two different electrical connectors, the uniformity of the current spreading can be enhanced by reasonably adding the amounts of the branch parts, the end parts, or both. However, if the current network formed between the electrical connectors is too dense, the effective light energy entering or leaving the optoelectronic semiconductor device 10 is reduced.

Each root part or end part can be formed outward from the root part by the constant distance, the different distances, the constant angle, or the different angles. The end part can be formed outward from the branch part by the constant distance, the different distances, or in the interlaced form. The geometric appearance of each branch part and end part can be a straight line, a curve, or the combination thereof. The type of the curve includes at least one of a hyperbola, a parabola, an ellipse, a circle, a power series curve, and a helix.

As shown in FIG. 16, the total end-part amounts of the first electrical connector 18a and 18b are fewer than the sum of the end-part amounts of the second electrical connector 17 (connecting to the root parts 171 directly) and the branch-part amounts of the second electrical connector 17 (between the root parts 171 and the end parts 173), however, it is not a limitation of present application. In other words, the amounts of the major interdigital part of the first electrical connector 18a and 18b can be more than or equal to the amounts of the major interdigital part of the second electrical connector 17. Moreover, the amounts of the major interdigital part of the first electrical connector 18a can be more than, equal to, or less than the amounts of the major interdigital part of the first electrical connector 18b.

The height, the width, or both of them of the root parts, the branch parts, or the end parts can be a constant, a gradual change, or a random value. For example, the root part, the branch part, and the end part have the same height. The root part has the largest width, the branch part is in the middle, and the end part has the smallest one. Moreover, the sizes of any two of the first electrical connector 18a, the first electrical connector 18b or the second electrical connector 17 can be the same, different, or partly the same. In one embodiment, the electrical connector as shown in FIG. 16 is formed on one 45 mil×45 mil or larger light emitting diode chip, among which, the height of the root parts, the branch parts, and the end parts is 2 µm, the widths of the end parts 183 of the first electrical connectors 18a and 18b are 9 µm and 7 µm respectively, and the width of the second electrical connectors 17 is 9 µm.

As shown in the drawing, a current blocking region 165 is further formed under the second electrical connector 17 (shown in the dotted line) to hinder the current from flowing downward or to adjust the way the current spreading downward. The current blocking region 165 achieves the above-mentioned effect by disposing an insulating material or a poor conductive material under the targeted region (the same as the second electrical connector 17 shown in FIG. 16). The size of current blocking region 165 is preferred to be equal to or slightly larger than the electrical connector formed above but is not a limitation of presentation application. However, a current blocking region 165 with an inappropriate size excessively increases the operating voltage of the optoelectronic semiconductor device 10. For example, if in a 45 mil×45 mil light emitting chip mentioned in the former section, the extension size of the current blocking region 165 is changed from 7 µm to 5 µm counting from the second electrical connector 17, the forward voltage can decrease 0.02 volt. Besides, the current blocking region 165 can be optionally formed in any single layer, multiple layers or discontinuous layers which is/are under the electrical connector. If the current blocking region is formed in the multiple layers, the size and the shape is not limited to be the same.

Figure 17:
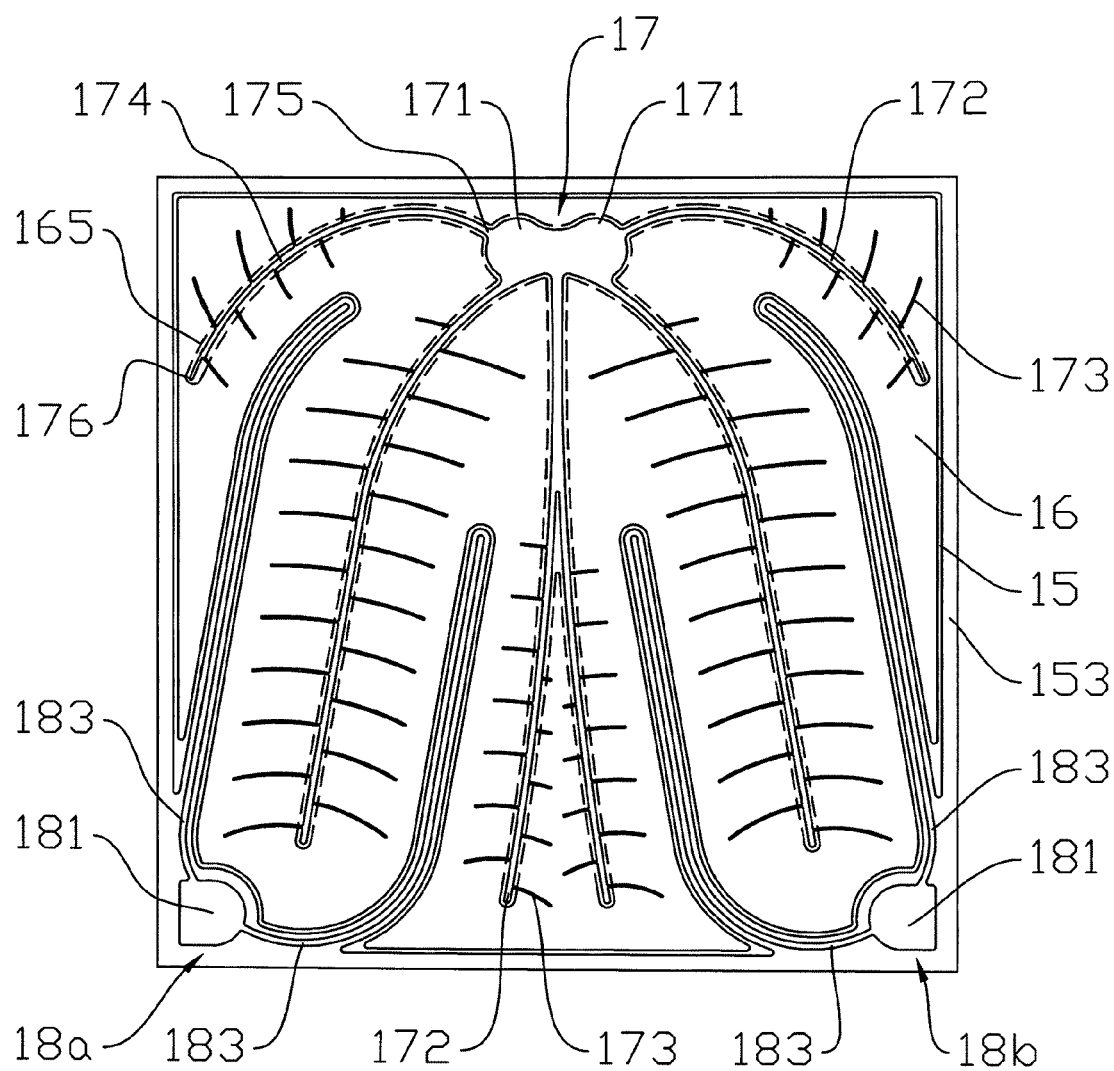
FIG. 17 illustrates a top view of an optoelectronic semiconductor device in accordance with another embodiment of present application.

As shown in FIG. 17, an optoelectronic semiconductor device 10 having a first electrical connector 18a, a first electrical connector 18b, and a second electrical connector 17 in accordance with another embodiment is disclosed. Each of the first electrical connectors 18a and 18b includes one root part 181 and two end parts 183 respectively. The second electrical connector 17 includes two adjacent root parts 171, six branch parts 172, and several end parts 173 extending from the corresponding branch parts. Specifically speaking, the branch part includes one trunk 174, one first end 175, and one second end 176. The first end 175 connects to the root part 171. The second end 176 is optionally an open end. The end part 173 connects to the trunk 174. Among which, the two branch parts 172 located in the center of the drawing partly connect to each other in appearance. Besides, the illustration of the other parts can be referred to FIG. 16.

Figure 18:
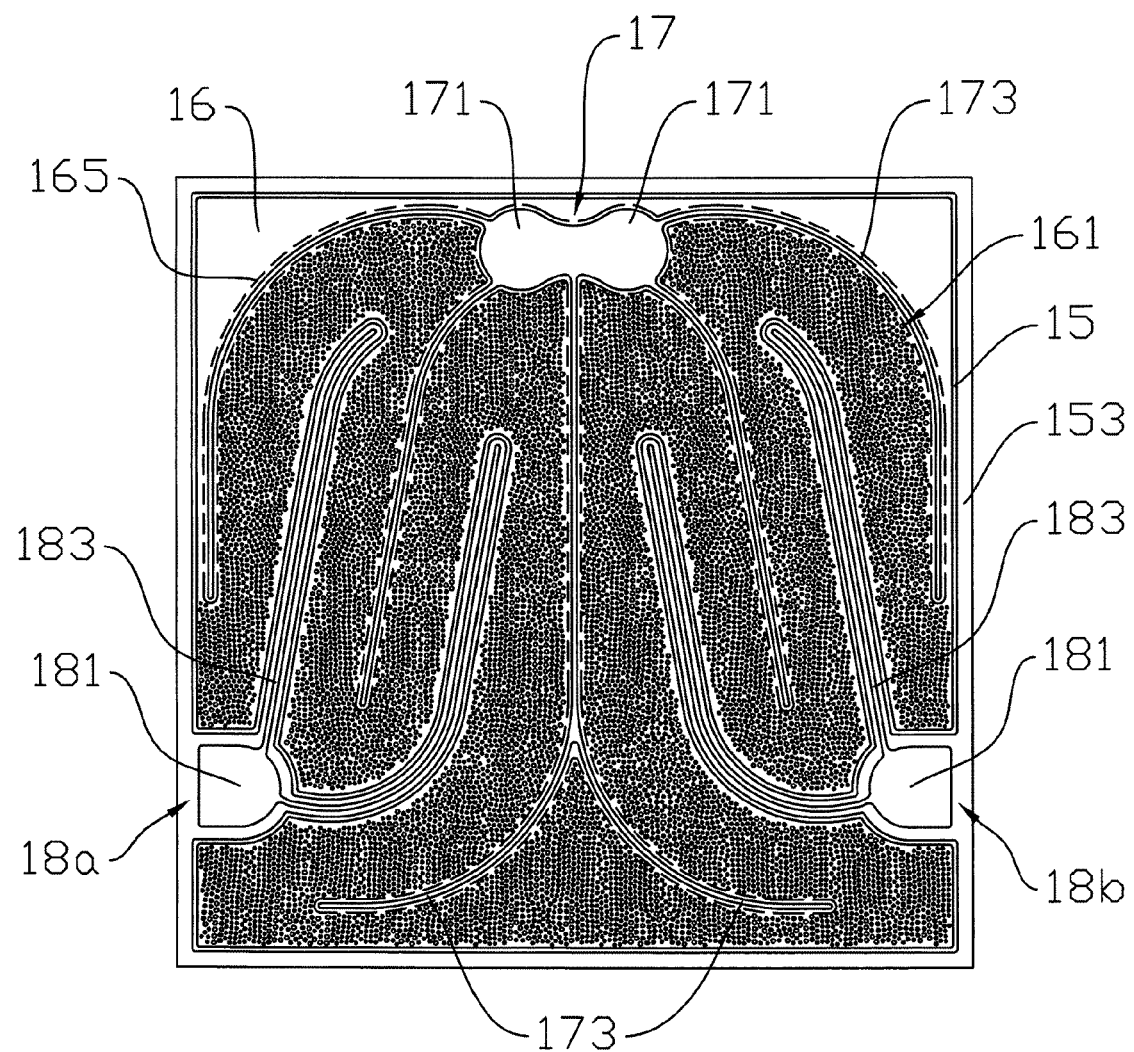
FIG. 18 illustrates a top view of an optoelectronic semiconductor device in accordance with another embodiment of present application.

As shown in FIG. 18, an optoelectronic semiconductor device 10 having a first electrical connector 18a, a first electrical connector 18b, and a second electrical connector 17 in accordance with another embodiment is disclosed. Each of the first electrical connectors 18a and 18b is formed on the platform 153 and includes one root part 181 and two end parts 183 respectively, and each of the end parts 183 is on the corner distant from the platform 153 respectively. The second electrical connector 17 is formed on the contact layer 16 and includes two adjacent root parts 171 and six end parts 173. Among which, the two end parts 173 located in the center of the figure partly connect to each other in appearance and the contact layer 16 forms the discontinuous regions 161 in the discrete random distribution. Other embodiments about the discontinuous regions 161 can be referred to the above-mentioned illustrations. Besides, the illustration of the other parts can be referred to FIG. 16.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. An optoelectronic semiconductor device, comprising:
    a substrate;
    a semiconductor system including a first conductivity layer, a second conductivity layer, and a conversion unit between the first conductivity layer and the second conductivity layer, wherein the first conductivity layer is closer to the substrate than the second conductivity layer is to the substrate, the second conductivity layer comprises a top surface perpendicular to a thickness direction of the semiconductor system, and in a top view of the semiconductor system, an outline of the first conductivity layer surrounds an outline of the second conductivity layer;
    an electrical connector on the semiconductor system;
    a contact layer having an outer perimeter extending around an entire outer edge of the contact layer and being at an inner side of the outline of the second conductivity layer in the top view of the semiconductor system; and
    at least three successive discontinuous regions connecting to the outer perimeter, extending inwardly from the outer perimeter in a non-periodic pattern, and extending parallel to the top surface of the second conductivity layer, wherein the at least three successive discontinuous regions have at least one different factor, and a bottom of the at least three successive discontinuous regions exposes the top surface of the second conductivity layer.

2. The optoelectronic semiconductor device of claim 1, wherein the factor comprises an angle, a length, a width, a depth, or a distance.

3. The optoelectronic semiconductor device of claim 1, wherein the electrical connector comprises a root part, a branch part, and an end part.

4. The optoelectronic semiconductor device of claim 1, wherein the electrical connector further comprises a region connecting to an outer circuit.

5. The optoelectronic semiconductor device of claim 1, wherein the electrical connector further comprises at least one intersection point with the discontinuous regions in one projection direction.

6. The optoelectronic semiconductor device of claim 1, further comprising a current blocking region disposed under at least one of the discontinuous regions.

7. The optoelectronic semiconductor device of claim 1, wherein each of the discontinuous regions comprises only one opening at the outer perimeter.

8. The optoelectronic semiconductor device of claim 1, wherein the discontinuous regions comprise at least one current blocking region.

9. The optoelectronic semiconductor device of claim 1, wherein the outer perimeter is the outermost perimeter of the contact layer.

10. An optoelectronic semiconductor device, comprising:
a substrate;
a semiconductor system including a first conductivity layer, a second conductivity layer, and a conversion unit between the first conductivity layer and the second conductivity layer, wherein the first conductivity layer is closer to the substrate than the second conductivity layer is to the substrate, the second conductivity layer comprises a top surface perpendicular to a thickness direction of the semiconductor system, and in a top view of the semiconductor system, an outline of the first conductivity layer surrounds an outline of the second conductivity layer;
a first electrical connector adjacent to the conversion unit;
a second electrical connector constructing one of two ends of a current channel with the first electrical connector;
a contact layer having an outer perimeter extending around an entire outer edge of the contact layer and being at an inner side of the outline of the second conductivity layer in the top view of the semiconductor system; and
a plurality of discontinuous regions connecting to the outer perimeter, extending inwardly from the outer perimeter in a non-periodic pattern, and extending parallel to the top surface of the second conductivity layer, wherein a bottom of the plurality of discontinuous regions exposes the top surface of the second conductivity layer.

11. The optoelectronic semiconductor device of claim 10, wherein the distances from each discontinuous region to the nearest electrical connector are substantially the same.

12. The optoelectronic semiconductor device of claim 10, wherein the conversion unit further comprises a first side and a second side opposite to the first side, and the first electrical connector and the second electrical connector are on the first side and on the second side, respectively.

13. The optoelectronic semiconductor device of claim 10, wherein the substrate has a top side, and the first electrical connector and the second electrical connector are on the top side of the substrate.

14. The optoelectronic semiconductor device of claim 10 further comprising an ohmic contact region disposed under the contact layer, the discontinuous region, or both of them.

15. The optoelectronic semiconductor device of claim 10, wherein at least one of the discontinuous regions deviates from an overall variation tendency.

16. The optoelectronic semiconductor device of claim 10, wherein at least one of the first electrical connector and the second electrical connector is in bilateral symmetry.

17. The optoelectronic semiconductor device of claim 10, wherein at least two of the discontinuous regions have a common opening at the outer perimeter.

18. The optoelectronic semiconductor device of claim 10, wherein the outer perimeter is the outermost perimeter of the contact layer.

19. An optoelectronic semiconductor device, comprising:
a substrate;
a semiconductor system including a first conductivity layer, a second conductivity layer, and a conversion unit between the first conductivity layer and the second conductivity layer, wherein the first conductivity layer is closer to the substrate than the second conductivity layer is to the substrate, the second conductivity layer comprises a top surface perpendicular to a thickness direction of the semiconductor system, and in a top view of the semiconductor system, an outline of the first conductivity layer surrounds an outline of the second conductivity layer;
an electrical connector disposed on one side of the conversion unit;
a contact layer having an outer perimeter extending around an entire outer edge of the contact layer and being at an inner side of the outline of the second conductivity layer in the top view of the semiconductor system; and
a plurality of discontinuous regions connecting to the outer perimeter, extending inwardly from the outer perimeter in a non-periodic pattern toward the electrical connector, extending parallel to the top surface of the second conductivity layer, and presenting an irregular variation in one dimension, and a bottom of the plurality of discontinuous regions exposes the top surface of the second conductivity layer.

20. The optoelectronic semiconductor device of claim 19, wherein the contact layer and the discontinuous regions are disposed between the electrical connector and the conversion unit.

21. The optoelectronic semiconductor device of claim 19, wherein the discontinuous regions have the discontinuity in at least one of the geometry, the material, the physical property, and the chemical property.

22. The optoelectronic semiconductor device of claim 19, further comprising an ohmic contact region disposed under the contact layer, the discontinuous regions, or both of them; wherein the ohmic contact region includes a protruding space, a depressive space, or both of them, the geometry of which is at least one of the pyramid, the cone, or the frustum.

23. The optoelectronic semiconductor device of claim 19, wherein the outer perimeter is the outermost perimeter of the contact layer.

* * * * *